US012684956B2

(12) United States Patent
Hong et al.

(10) Patent No.: US 12,684,956 B2
(45) Date of Patent: Jul. 14, 2026

(54) DISPLAY DEVICE AND METHOD FOR MANUFACTURING THE SAME

(71) Applicant: Samsung Display Co., LTD., Yongin-si (KR)

(72) Inventors: Sung Jin Hong, Yongin-si (KR); Sun Ho Kim, Yongin-si (KR); Yoo Min Ko, Yongin-si (KR); Hye Won Kim, Yongin-si (KR); Ju Chan Park, Yongin-si (KR); Pil Suk Lee, Yongin-si (KR); Chung Sock Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 379 days.

(21) Appl. No.: 18/469,865

(22) Filed: Sep. 19, 2023

(65) Prior Publication Data

US 2024/0099072 A1 Mar. 21, 2024

(30) Foreign Application Priority Data

Sep. 20, 2022 (KR) ........................ 10-2022-0118641

(51) Int. Cl.
*H10K 59/122* (2023.01)
*G09G 3/3233* (2016.01)
(Continued)

(52) U.S. Cl.
CPC ......... *H10K 59/122* (2023.02); *G09G 3/3233* (2013.01); *H10K 59/1201* (2023.02);
(Continued)

(58) Field of Classification Search
CPC .... H10K 59/122; H10K 50/82; H10K 50/822; H10K 50/824; H10K 59/131;
(Continued)

(56) References Cited

U.S. PATENT DOCUMENTS

2022/0157899 A1* 5/2022 Yanagisawa ........... H10K 59/88
2023/0209910 A1* 6/2023 Park ..................... H10K 59/122
257/40
2024/0147780 A1 5/2024 Hong et al.

FOREIGN PATENT DOCUMENTS

CN 103280539 9/2013
KR 10-2015-0075017 7/2015
(Continued)

*Primary Examiner* — Wasiul Haider
(74) *Attorney, Agent, or Firm* — F. CHAU & ASSOCIATES, LLC

(57) ABSTRACT

Disclosed are a display device and a method for manufacturing the same. The display device according to an embodiment includes a transistor that is disposed on a substrate, a first electrode that is disposed on the substrate, a pixel defining layer that is disposed on the first electrode, a separator pattern that is disposed on the pixel defining layer, auxiliary wiring that is disposed between the pixel defining layer and the separator pattern, a second electrode that is disposed on the first electrode, the pixel defining layer, and the separator pattern, connection wiring that connects the transistor to the second electrode, and an intermediate layer that is disposed between the first electrode and the second electrode. A portion of the second electrode disposed on the separator pattern and a portion of the second electrode disposed around the separator pattern are separated from each other.

24 Claims, 20 Drawing Sheets

(51) Int. Cl.
    *H10K 59/12*     (2023.01)
    *H10K 59/131*     (2023.01)

(52) U.S. Cl.
    CPC ... *H10K 59/131* (2023.02); *G09G 2300/0426*
        (2013.01); *G09G 2300/0819* (2013.01); *G09G*
                           *2300/0852* (2013.01)

(58) Field of Classification Search
    CPC .. H10K 59/1315; H10K 50/81; H10K 59/123;
             G09G 3/3233; G09G 2300/0426; G09G
             2300/0819; G09G 2300/0852; G09G
             2300/0814; G09G 2300/0861; G09G
                           2300/0866
    See application file for complete search history.

(56)                   References Cited

FOREIGN PATENT DOCUMENTS

| KR | 10-2019-0081962 | 7/2019 |
|----|-----------------|--------|
| KR | 10-2020-0108145 | 9/2020 |
| KR | 10-2024-0065576 | 5/2024 |

\* cited by examiner 181
160
142
141
120
110

LB S1 A1 G1 D1 EWa EWb EWc   CE1 CE2 CE3

TR   EW

Z

DISPLAY DEVICE AND METHOD FOR MANUFACTURING THE SAME

CROSS-REFERENCE TO RELATED APPLICATION(S)

This application claims priority to and benefits of Korean Patent Application No. 10-2022-0118641 under 35 U.S.C. § 119, filed in the Korean Intellectual Property Office on Sep. 20, 2022, the entire contents of which are incorporated herein by reference.

BACKGROUND

1. Technical Field

The disclosure relates to a display device and a method for manufacturing the same.

2. Description of the Related Art

A display device is a device for displaying an image, and includes a liquid crystal display device (LCD), an organic light emitting display device (OLED), and the like. The display device is used in various electronic devices such as a mobile phone, a navigation device, a digital camera, an electronic book, a portable game machine, and other various terminals.

An organic light emitting display device includes two electrodes and an organic light emitting layer interposed therebetween, wherein electrons injected from one electrode and holes injected from another electrode are recombined in the organic light emitting layer to generate excitons. The generated excitons are changed to a ground state from an excited state, releasing energy to emit light.

The above information disclosed in this Background section is only for enhancement of understanding of the background of the described technology, and therefore it may contain information that does not form the prior art that is already known in this country to a person of ordinary skill in the art.

SUMMARY

A display device may include multiple pixels, and each pixel may include a light emitting device and a pixel driving circuit connected to the light emitting device. The pixel driving circuit may include an N-type transistor (or an NMOS transistor) and/or a P-type transistor (or a PMOS transistor). In case that the pixel driving circuit is configured with the N-type transistor, a source voltage of a driving transistor may be shifted due to a degradation of the light emitting device so that the light emitting device is susceptible to an afterimage or a decrease in luminance is accelerated. Thus, display quality may be deteriorated.

Embodiments provide a display device and a method for manufacturing the same capable of improving display quality.

A display device according to an embodiment may include a transistor that is disposed on a substrate, a first electrode that is disposed on the substrate, a pixel defining layer that is disposed on the first electrode, a separator pattern that is disposed on the pixel defining layer, auxiliary wiring that is disposed between the pixel defining layer and the separator pattern, a second electrode that is disposed on the first electrode, the pixel defining layer, and the separator pattern, connection wiring that connects between the transistor and the second electrode, and an intermediate layer that is disposed between the first electrode and the second electrode. A portion of the second electrode disposed on the separator pattern and a portion of the second electrode disposed around the separator pattern may be separated from each other.

The display device may include a display area that displays an image, and a peripheral area that surrounds the display area. The auxiliary wiring may be disposed in the display area and the peripheral area.

The display device may further include a first power voltage line disposed in the peripheral area and transmitting a high potential power voltage. The auxiliary wiring may be connected to the first power voltage line.

The pixel defining layer may be disposed on the first power voltage line, the pixel defining layer may include an opening overlapping the first power voltage line, and the auxiliary wiring may be connected to the first power voltage line in the opening.

The separator pattern may be disposed on the auxiliary wiring in the peripheral area, and a width of the auxiliary wiring may be the same as a width of a lower portion of the separator pattern.

The separator pattern may be disposed on the auxiliary wiring and the pixel defining layer in the peripheral area, and a width of the auxiliary wiring may be narrower than a width of a lower portion of the separator pattern.

The separator pattern may be disposed in the display area and may not be disposed in the peripheral area, and the intermediate layer may be disposed directly above the auxiliary wiring in the peripheral area.

The first power voltage line may be disposed on a same layer as the first electrode.

The auxiliary wiring disposed in the display area and the auxiliary wiring disposed in the peripheral area may be integrally formed by being connected to each other.

The auxiliary wiring disposed in the display area may have a net shape in a plan view, and the auxiliary wiring disposed in the peripheral area may have a shape surrounding the display area in the plan view.

A constant voltage may be applied to the auxiliary wiring.

The auxiliary wiring may include an oxide semiconductor.

The pixel defining layer may include a positive type photosensitive resin, and the separator pattern may include a negative type photosensitive resin.

A method for manufacturing a display device according to an embodiment may include forming a transistor above a substrate, forming connection wiring connected to the transistor, forming an insulating layer on the connection wiring, forming a first electrode on the insulating layer, forming a pixel defining layer on the first electrode, patterning the pixel defining layer to form a first opening overlapping the first electrode and a second opening overlapping the connection wiring, forming auxiliary wiring and a separator pattern that overlap each other above the pixel defining layer, forming an intermediate layer above the first electrode, the pixel defining layer, and the separator pattern, and forming a second electrode connected to the connection wiring on the intermediate layer.

The forming of the pixel defining layer and the separator pattern may include sequentially stacking a first material layer and a second material layer on the pixel defining layer, forming the separator pattern by patterning the second material layer, and forming the auxiliary wiring by patterning the first material layer using the separator pattern as a mask.

The first material layer may include an oxide semiconductor, and the second material layer may include a negative type photosensitive resin.

The pixel defining layer may include a positive type photosensitive resin.

A width of the first opening and a width of the second opening may be gradually widened as the first opening and the second opening move away from the substrate, and a width of the separator pattern may be gradually widened as the separator pattern moves away from the substrate.

A width of the auxiliary wiring may be the same as a width of a lower portion of the separator pattern.

The forming of the pixel defining layer and the separator pattern may include forming a first material layer on the pixel defining layer, patterning the first material layer to form the auxiliary wiring, forming a second material layer on the auxiliary wiring, and patterning the second material layer to form the separator pattern.

A width of the auxiliary wiring may be narrower than a width of a lower portion of the separator pattern.

The display device may include a display area that displays an image, and a peripheral area that surrounds the display area. The auxiliary wiring may be disposed in the display area and the peripheral area.

The forming of the first electrode may further include forming a first power voltage line that transmits a high potential power voltage in the peripheral area. The auxiliary wiring may be connected to the first power voltage line.

The forming of the first opening and the second opening in the pixel defining layer may further include forming a third opening overlapping the first power voltage line in the pixel defining layer, and the auxiliary wiring may be connected to the first power voltage line in the third opening.

According to the embodiments, display quality of the display device may be improved.

DETAILED DESCRIPTION OF THE EMBODIMENTS

Figure 1:
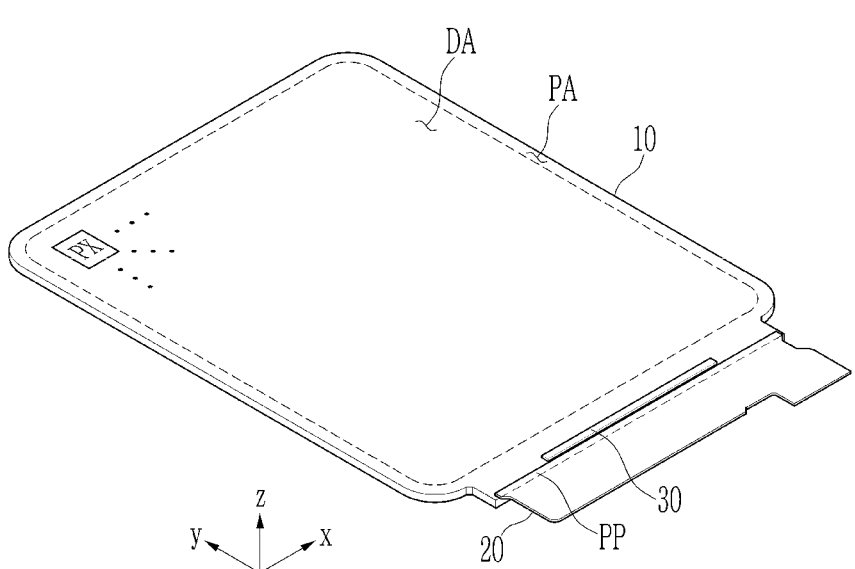
FIG. 1 is a perspective view schematically illustrating a display device according to an embodiment.

The disclosure will be described more fully hereinafter with reference to the accompanying drawings, in which embodiments are shown. As those skilled in the art would realize, the described embodiments may be modified in various different ways, all without departing from the spirit or scope of the disclosure.

In order to clearly describe the disclosure, parts or portions that are irrelevant to the description may be omitted, and identical or similar constituent elements throughout the specification are denoted by the same reference numerals.

Further, in the drawings, the size and thickness of each element may be arbitrarily illustrated for ease of description, and the disclosure is not necessarily limited to those illustrated in the drawings.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean any combination including "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean any combination including "A, B, or A and B."

It will be understood that when an element such as a layer, film, region, area, or substrate is referred to as being "on" another element, it can be directly on the other element or intervening elements may also be present. In contrast, when an element is referred to as being "directly on" another element, there may be no intervening elements present. Further, in the specification, the word "on" or "above" may mean positioned or disposed on or below the object portion, and does not necessarily mean positioned or disposed on the upper side of the object portion based on a gravitational direction. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "comprises," and/or "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

In the drawings, the symbols "x", "y", and "z" are used to indicate directions. The symbol "x" denotes a first direction, the symbol "y" denotes a second direction that is perpendicular to the first direction, and the symbol "z" denotes a third direction that is perpendicular to the first direction and the second direction.

It will be understood that the terms "connected to" or "coupled to" may include a physical and/or electrical connection or coupling.

"About", "approximately" or "substantially" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a perspective view schematically illustrating a display device according to an embodiment.

As shown in FIG. 1, the display device according to an embodiment may include a display panel 10, a flexible printed circuit film 20 bonded to the display panel 10, and a driving device including an integrated circuit chip 30 and the like. The display device may be used to display an image in an electronic device such as a mobile phone, a smart phone, a tablet personal computer (PC), a laptop computer, a monitor, a multimedia player, a game console, or the like.

The display panel 10 may include a display area DA corresponding to an area on which an image is displayed, and a peripheral area PA in which circuits and/or wirings for generating and/or transmitting various signals applied to the display area DA may be disposed. The peripheral area PA may surround the display area DA. In FIG. 1, an inside of a closed loop formed of a dotted line may be the display area DA, and an outside of the closed loop may be the peripheral area PA. The display area DA may be formed in a substantially rectangular shape in a plan view. A corner portion of the display area DA may have a rounded shape. However, the shape of the display area DA is only an example, and may be variously changed. For example, the display area DA may have various shapes such as a quadrangle, other polygons, a circle, an oval, and the like.

Pixels PX may be disposed in a matrix in the display area DA of the display panel 10. Wiring such as a gate line, a data line, a power voltage line, and/or the like may be disposed in the display area DA. The gate line may extend approximately in the first direction x, the data line may extend approximately in the second direction y, and the power voltage line may extend approximately in the first direction x and/or the second direction y. The gate line, the data line, the power voltage line, and the like may be connected to each pixel PX, and each pixel PX may receive a gate signal (also referred to as a scan signal), a data voltage, a power voltage, and the like from wirings of the gate line, the data line, the power voltage line, and the like. Each pixel PX may include a light emitting device and a pixel driving circuit connected to the light emitting device. The pixel driving circuit may be connected to an end of the light emitting device and may be a unit circuit that includes devices including a driving transistor. The pixel driving circuit may generate a driving current based on signals applied through the wirings such as the gate line, the data line, and the like to apply the driving current to the light emitting device.

Although a touch sensor for sensing a contact touch and/or a non-contact touch of a user is not shown in FIG. 1, the touch sensor may be disposed in the display area DA.

A pad portion PP at which pads for receiving signals from the outside of the display panel 10 are arranged may be disposed in the peripheral area PA of the display panel 10. The pad portion PP may be elongated in the first direction x along one edge of the display panel 10. The pads may be disposed to be spaced apart from each other at a predetermined or selected interval along the first direction x. The flexible printed circuit film 20 may be bonded to the pad portion PP, and pads of the flexible printed circuit film 20 may be electrically connected to the pads of the pad portion PP.

A driving device (or a driving unit) that generates and/or processes various signals for driving the display panel 10 may be disposed in the peripheral area PA of the display panel 10. The driving device may include a data driver that applies a data voltage to data lines, a gate driver that applies the gate signal to gate lines, and a timing controller that controls the data driver and the gate driver. The pixels PX may receive the data voltage at predetermined or selected timing according to a gate signal generated by the gate driver. The gate driver may be integrated at the display panel 10 and may be disposed at at least one side of the display area DA. The data driver and the timing controller may be provided as the integrated circuit chip (also referred to as a driving IC chip or a driving IC) 30, and the integrated circuit chip 30 may be mounted at the peripheral area PA of the display panel 10. The integrated circuit chip 30 may be mounted at the flexible printed circuit film 20 or the like so that the integrated circuit chip 30 is electrically connected to the display panel 10.

Figure 2:
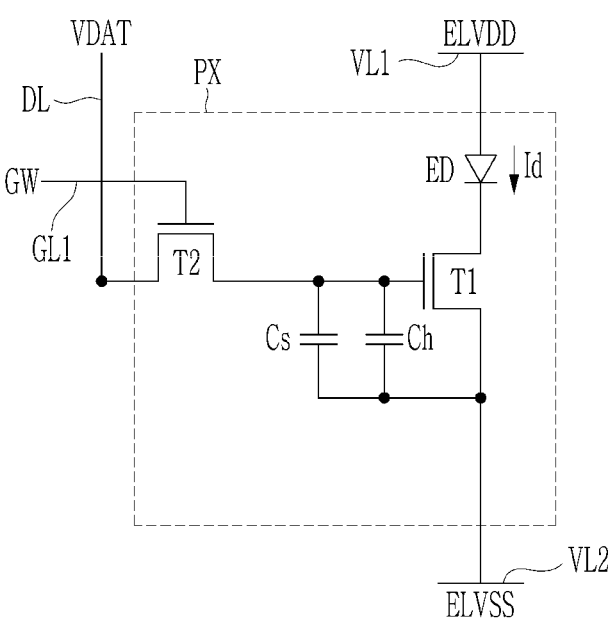
FIG. 2 is a circuit diagram schematically illustrating a pixel of the display device according to an embodiment.
Figure 3:
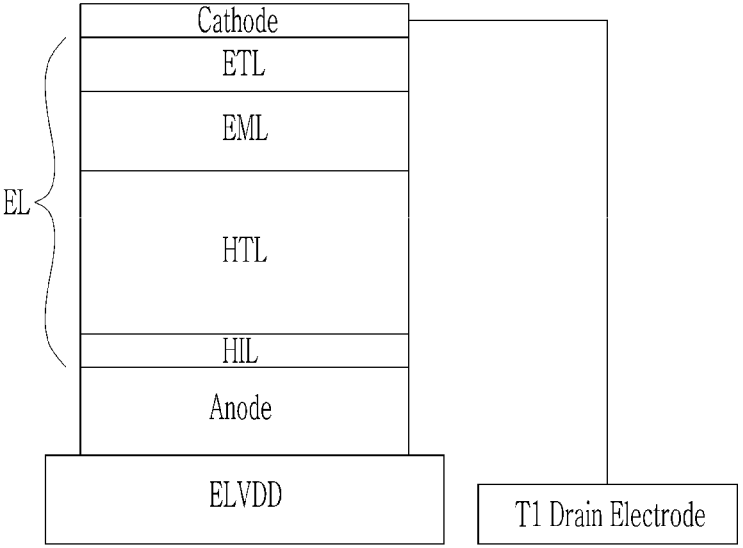
FIG. 3 is a diagram schematically illustrating a stacked structure of a light emitting device of the display device according to an embodiment.

FIG. 2 is a circuit diagram schematically illustrating a pixel of the display device according to an embodiment. FIG. 3 is a diagram schematically illustrating a stacked structure of the light emitting device of the display device according to an embodiment.

Referring to FIG. 2, the display device according to an embodiment may include the pixels PX, and each of the pixels PX may include the light emitting device ED and the pixel driving circuit connected to the light emitting device ED. The pixel driving circuit may include transistors T1 and T2 and capacitors Cs and Ch. The light emitting device ED may be an organic light emitting diode or an inorganic light emitting diode, but is not limited thereto. Multiple wirings GL1, DL, VL1, and VL2 may be connected to the pixel driving circuit. Although a structure in which one pixel PX includes two transistors T1 and T2 and two capacitors Cs and Ch is illustrated in FIG. 2, the disclosure is not limited thereto. The number of the transistor and the capacitor may be variously changed. Although a structure in which four wirings GL1, DL, VL1, and VL2 are connected to one pixel PX is illustrated in FIG. 2, the disclosure is not limited thereto. A type and the number of the wirings may be variously changed.

The wirings GL1, DL, VL1, and VL2 may include a scan line GL1, a data line DL, a first power voltage line (a first power supply voltage line) VL1, and a second power voltage line VL2. The scan line GL1 may be electrically connected to the gate driver. The data line DL may be electrically connected to the data driver. The first power voltage line VL1 and the second power voltage line VL2 may be connected to a voltage generator. The scan line GL1 may transmit a scan signal GW to a second transistor T2. The data line DL may transmit a data voltage VDAT. The first power voltage line (also referred to as a high electric potential voltage line) VL1 may transmit a first power voltage (also referred to as a high electric potential power voltage) ELVDD. The second power voltage line (also referred to as a low electric potential voltage line) VL2 may transmit a second power voltage (also referred to as a low electric potential power voltage) ELVSS.

The transistors T1 and T2 may include a first transistor T1 that is a driving transistor, and the second transistor T2 that is a switching transistor. Each of the transistors T1 and T2 may include a gate electrode, a source electrode, and a drain electrode. The transistors T1 and T2 may be N-type transistors, but at least one of the transistors T1 and T2 may be a P-type transistor.

A gate electrode of the first transistor T1 may be connected to one capacitor electrode of the first capacitor Cs, one capacitor electrode of the second capacitor Ch and one electrode of the second transistor T2, a source electrode of the first transistor T1 may be connected to the other capacitor electrode of the first capacitor Cs and the other capacitor electrode of the second capacitor Ch, and a drain electrode of the first transistor T1 may be connected to a cathode of the light emitting device ED. The first transistor T1 may control a driving current Id flowing through the light emitting device ED according to a magnitude of the data voltage VDAT transferred through the second transistor T2, and the light emitting device ED may emit light with a luminance that varies according to a magnitude of the driving current Id. Accordingly, each pixel PX may display a grayscale by adjusting an amount of current flowing through the first transistor T1 according to the magnitude of the data voltage VDAT.

A gate electrode of the second transistor T2 may be connected to the scan line GL1, the other electrode of the second transistor T2 may be connected to the data line DL, and the one electrode of the second transistor T2 may be connected to the gate electrode of the first transistor T1 and the one capacitor electrode of the first capacitor Cs. The second transistor T2 may be turned on according to the scan signal GW transmitted through the scan line GL1 so that the second transistor T2 performs a switching operation of transferring the data voltage VDAT transmitted through the data line DL to the gate electrode of the first transistor T1 and the one capacitor electrode of the first capacitor Cs.

The one capacitor electrode of the first capacitor Cs may be connected to the gate electrode of the first transistor T1 and the one electrode of the second transistor T2, and the other capacitor electrode of the first capacitor Cs may be connected to the source electrode of the first transistor T1. The first capacitor Cs may continuously apply a charged data voltage VDAT to the first transistor T1 so that the light emitting device ED continuously emits light during a light emitting period.

An anode of the light emitting device ED may be connected to the first power voltage line VL1, and the cathode of the light emitting device ED may be connected to the drain electrode of the first transistor T1. Since the first transistor T1 is an N-type transistor and the first power voltage line VL1 and the second power voltage line VL2 apply the first power voltage ELVDD and the second power voltage ELVSS, respectively, a terminal of the first transistor T1 connected to the cathode of the light emitting device ED may be a drain electrode.

Referring to FIG. 3, the light emitting device ED may include the anode receiving the first power voltage ELVDD, the cathode electrically connected to the drain electrode of the first transistor T1, and an intermediate layer EL disposed between the anode and the cathode. The intermediate layer EL may include a light emitting layer EML and a functional layer. The light emitting layer EML may be a layer in which electro-optical conversion is performed through a recombination of an electron and a hole, and may include an organic material and/or an inorganic material that emits light of a predetermined or selected color. The functional layer may include at least one of a hole injection layer HIL, a hole transport layer HTL, an electron transport layer ETL, and an electron injection layer (not shown). The hole injection layer HIL and the hole transport layer HTL disposed between the anode and the light emitting layer EML, and the electron transport layer ETL disposed between the light emitting layer EML and the cathode are illustrated in FIG. 3.

The pixel driving circuit may include N-type transistors T1 and T2. Thus, if the anode of the light emitting device ED is connected to the source electrode of the first transistor T1, a source voltage of the first transistor T1 may be shifted due to a degradation of the light emitting device ED so that a gate-source voltage Vgs of the first transistor T1 is changed. As a result, a range of change in the driving current Id may increase so that the light emitting device ED is vulnerable to an afterimage or a decrease in luminance is accelerated. In an embodiment, a pixel driving circuit is configured so that the cathode of the light emitting device ED is connected to the drain electrode of the first transistor T1. Thus, the gate-source voltage Vgs of the first transistor T1 may not be changed even in case that the light emitting device ED is degraded. As a result, a range of change in the driving current Id may be reduced so that an afterimage and luminance degradation are prevented.

In order to connect the cathode of the light emitting device ED to the drain electrode of the first transistor T1, the light emitting device in which the cathode is disposed at a lower portion and the anode is disposed at an upper portion may be configured. However, the light emitting device may be disadvantageous in terms of a driving voltage, light emitting efficiency, and/or the like compared to a light emitting device where an anode is disposed at a lower portion and a cathode is disposed at an upper portion. In order to improve this disadvantage, the light emitting device ED according to an embodiment may have a structure in which the anode is disposed at a lower portion, the cathode is disposed at an upper portion, and the cathode is connected to the drain electrode of the first transistor T1.

Hereinafter, a structure of a pixel PX disposed in the display area DA of the display device according to an embodiment will be described with reference to FIG. 4.

Figure 4:
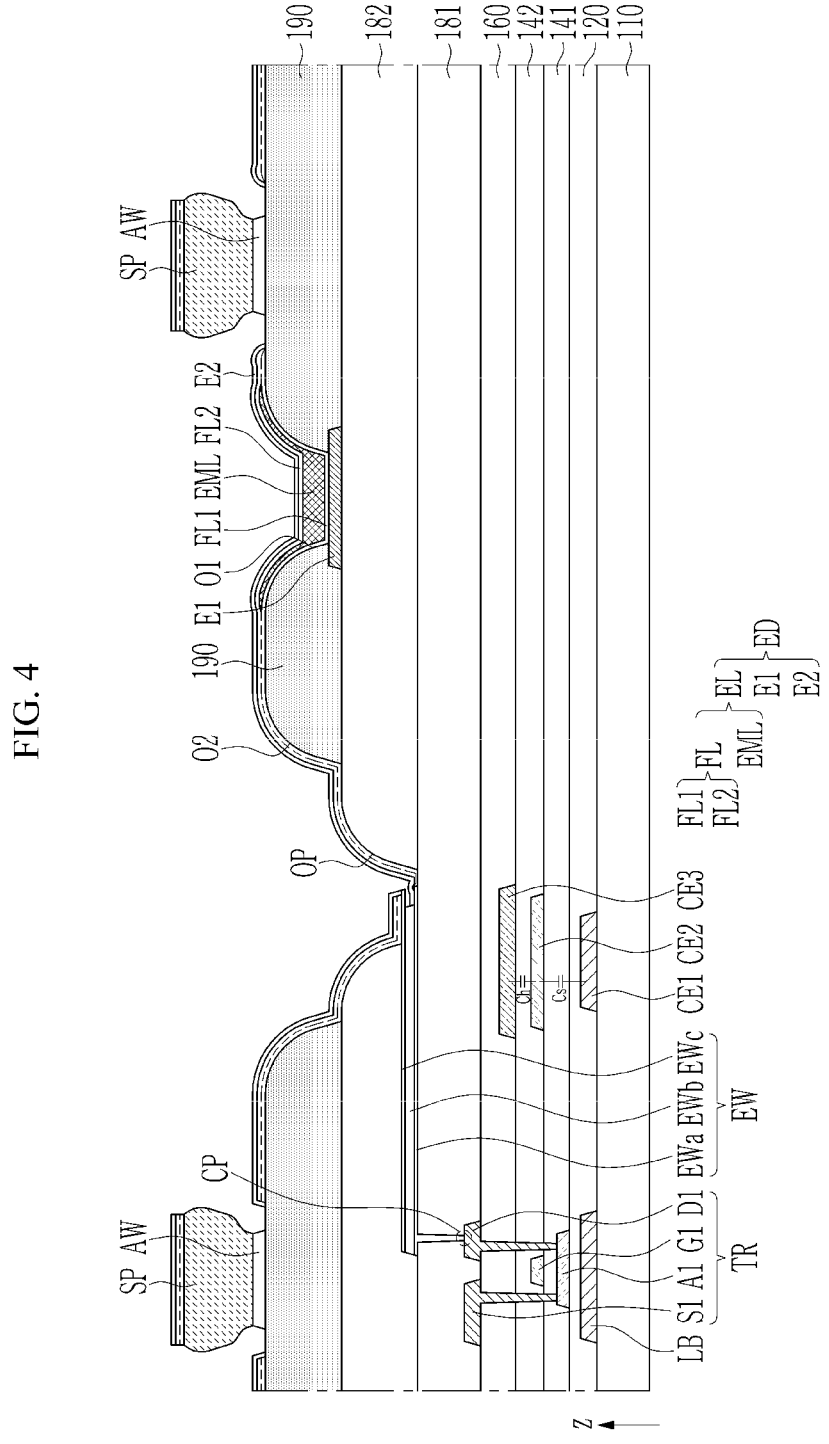
FIG. 4 is a cross-sectional view schematically illustrating the display device according to an embodiment.

FIG. 4 is a cross-sectional view schematically illustrating the display device according to an embodiment. FIG. 4 illustrates the pixel PX disposed in the display area DA of the display device according to an embodiment.

As shown in FIG. 4, the display device according to an embodiment may include a substrate 110, a transistor TR disposed on the substrate 110, and the light emitting device ED connected to the transistor TR. The transistor TR may be one of multiple transistors included in the pixel driving circuit.

The substrate 110 may be a rigid substrate or a flexible substrate capable of bending, folding, rolling, and/or the like. For example, the substrate 110 may include a material such as polystyrene, polyvinyl alcohol, poly(methyl methacrylate), polyethersulfone, polyacrylate, polyetherimide, polyethylene naphthalate, polyethylene terephthalate, polyphenylene sulfide, polyarylate, polyimide, polycarbonate, triacetate cellulose, cellulose acetate propionate, and/or the like. The substrate 110 may be a single layer or a multilayer. The substrate 110 may be alternately stacked with at least one base layer including sequentially stacked polymer resins, and at least one inorganic layer.

A first conductive layer that includes a light blocking layer LB, a first capacitor electrode CE1, and the like may be disposed above or on the substrate 110. The light blocking layer LB may prevent external light from reaching a semiconductor layer A1 (particularly, a channel region of the semiconductor layer A1) to be described later so that the light blocking layer LB prevents deterioration of a characteristic of the semiconductor layer A1, and the light blocking layer LB may control a leakage current of the transistor TR. Components included in the first conductive layer may be formed of the same material in the same process. For example, the light blocking layer LB, the first capacitor electrode CE1, and the like may be formed by depositing a conductive layer above the substrate 110 and by patterning the deposited layer using a photo and etching process. The first conductive layer may include molybdenum (Mo), aluminum (Al), copper (Cu), titanium (Ti), and/or the like, and may be a single layer or multiple layers.

A buffer layer 120 may be disposed on the first conductive layer. The buffer layer 120 may block an impurity from the substrate 110 in case that the semiconductor layer A1 is formed to improve a characteristic of the semiconductor layer A1, and may reduce a stress of the semiconductor layer A1 by planarizing a surface of the substrate 110. The buffer layer 120 may be an inorganic insulating layer that includes an inorganic insulating material such as a silicon nitride ($SiN_x$), a silicon oxide ($SiO_x$), a silicon oxynitride ($SiO_xN_y$), and/or the like, and may be a single layer or multiple layers.

The semiconductor layer A1 (also referred to as an active layer) may be disposed on the buffer layer 120. The semiconductor layer A1 may include a first region, a second region, and a channel region disposed between the first region and the second region. The semiconductor layer A1 may include a semiconductor material such as an oxide semiconductor, amorphous silicon, polycrystalline silicon, single crystal silicon, and/or the like. For example, the semiconductor layer A1 may include an oxide semiconductor material including at least one of zinc (Zn), indium (In), gallium (Ga), and tin (Sn). For example, the semiconductor layer A1 may include Indium-Gallium-Zinc Oxide (IGZO).

A first insulating layer 141 (also referred to as a first gate insulating layer) may be disposed on the semiconductor layer A1. The first insulating layer 141 may be an inorganic insulating layer that includes an inorganic insulating material such as a silicon nitride, a silicon oxide, a silicon oxynitride, and/or the like, and may be a single layer or multiple layers.

A second conductive layer (also referred to as a first gate conductive layer) that includes a gate electrode G1, a second capacitor electrode CE2, and the like may be disposed on the first insulating layer 141. Components included in the second conductive layer may be formed of the same material in the same process. For example, the gate electrode G1, the second capacitor electrode CE2, and the like may be formed by depositing a conductive layer on the first insulating layer 141 and by patterning the deposited layer using a photo and etching process. The gate electrode G1 may overlap the channel region of the semiconductor layer A1. The second capacitor electrode CE2 may overlap the first capacitor electrode CE1, and may form the first capacitor Cs together with the first capacitor electrode CE1. The second capacitor electrode CE2 and the gate electrode G1 may be different portions of one conductive pattern. The second capacitor electrode CE2 and the gate electrode G1 may be electrically connected to each other. The second conductive layer may include molybdenum (Mo), aluminum (Al), copper (Cu), silver (Ag), chromium (Cr), tantalum (Ta), titanium (Ti), and/or the like, and may be a single layer or a multilayer. For example, the second conductive layer may have a double layer, and may include a layer including aluminum (Al) and a layer including titanium (Ti).

After the second conductive layer is formed, a doping process or a plasma treatment may be performed. A portion of the semiconductor layer A1 covered by the gate electrode G1 may not be doped or plasma-treated, and a portion of the semiconductor layer A1 not covered by the gate electrode G1 may be doped or plasma-treated to have the same characteristic as a conductor. A region of the semiconductor layer A1 that overlaps the gate electrode G1 in a plan view may be the channel region.

A second insulating layer 142 (also referred to as a second gate insulating layer) may be disposed on the second conductive layer. The second insulating layer 142 may be an inorganic insulating layer that includes an inorganic insulating material such as a silicon nitride, a silicon oxide, a silicon oxynitride, and/or the like, and may be a single layer or multiple layers.

A third conductive layer (also referred to as a second gate conductive layer) that includes a third capacitor electrode CE3 and the like may be disposed on the second insulating layer 142. Components included in the third conductive layer may be formed of the same material in the same process. The third capacitor electrode CE3 may overlap the second capacitor electrode CE2, and may form a second capacitor Ch together with the second capacitor electrode CE2. The second capacitor Ch may stabilize a gate voltage of the transistor TR before the data voltage VDAT is applied. The second power voltage ELVSS may be applied to the third capacitor electrode CE3, but the disclosure is not limited thereto. The third conductive layer may include molybdenum (Mo), aluminum (Al), copper (Cu), silver (Ag), chromium (Cr), tantalum (Ta), titanium (Ti), and/or the like, and may be a single layer or a multilayer. For example, the third conductive layer may be formed of a double layer, and may include a layer including aluminum (Al) and a layer including titanium (Ti).

A third insulating layer 160 (also referred to as an interlayer insulating layer) may be disposed on the third conductive layer. The third insulating layer 160 may be an inorganic insulating layer that includes an inorganic insulating material such as a silicon nitride, a silicon oxide, a silicon oxynitride, and/or the like, and may be a single layer or multiple layers.

A fourth conductive layer (also referred to as a first data conductive layer) that includes a source electrode S1, a drain electrode D1, and the like may be disposed on the third insulating layer 160. Components included in the fourth conductive layer may be formed of the same material in the same process. The source electrode S1 and the drain electrode D1 may be respectively connected to the first region and the second region of the semiconductor layer A1 through contact holes formed in insulating layers 141, 142, and 160. The source electrode S1 and the drain electrode D1 may constitute the transistor TR together with the gate electrode G1 and the semiconductor layer A1. The transistor TR may be an N-type transistor. Although various transistors included in the pixel driving circuit are not illustrated in the drawings, each of the transistors included in the pixel driving circuit may have substantially the same stacked structure as the transistor TR described above. The fourth conductive layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), and/or the like, and may be a single layer or multiple layers. For example, the fourth conductive layer may have a triple-layer structure that includes a lower layer including a refractory metal such as molybdenum, chromium, tantalum, titanium, and/or the like or an alloy of the refractory metal, an intermediate layer including an aluminum-based metal, a silver-based metal, or a copper-based metal having low resistivity, and an upper layer including a refractory metal such as molybdenum, chromium, tantalum, titanium, and/or the like.

Although a connection relationship between the source electrode S1 and the light blocking layer LB is not shown in FIG. 4, the source electrode S1 may be connected to the light blocking layer LB through contact holes formed in the insulating layers 120, 141, 142, and 160. The disclosure is not limited thereto, and the light blocking layer LB may be connected to the gate electrode G1 instead of the source electrode S1. The gate electrode G1 may be connected to the light blocking layer LB through contact holes formed in the insulating layers 120 and 141. Light blocking layers of some transistors among multiple transistors included in the pixel driving circuit may be connected to the source electrode, and light blocking layers of other transistors among the transistors included in the pixel driving circuit may be connected to the gate electrode.

A fourth insulating layer 181 (also referred to as a first planarization layer) may be disposed on the fourth conductive layer. The fourth insulating layer 181 may include an organic insulating material such as a general-purpose polymer such as poly(methyl methacrylate) or polystyrene, a polymer derivative with a phenol-based group, an acryl-based polymer, an imide-based polymer (e.g., a polyimide), a siloxane-based polymer, and/or the like. The fourth insulating layer 181 may be referred to as a first organic insulating layer.

A fifth conductive layer (also referred to as a second data conductive layer) that includes connection wiring EW and the like may be disposed on the fourth insulating layer 181. Components included in the fifth conductive layer may be formed of the same material in the same process. The connection wiring EW may be connected to the drain electrode D1 of the transistor TR through a contact hole formed in the fourth insulating layer 181. The fifth conductive layer may include aluminum (Al), platinum (Pt), palladium (Pd), silver (Ag), magnesium (Mg), gold (Au), nickel (Ni), neodymium (Nd), iridium (Jr), chromium (Cr), calcium (Ca), molybdenum (Mo), titanium (Ti), tungsten (W), copper (Cu), and/or the like, and may be a single layer or multiple layers. For example, the fifth conductive layer may have a triple-layer structure that includes a lower layer including a refractory metal such as molybdenum, chromium, tantalum, titanium, and/or the like or an alloy of the refractory metal, an intermediate layer including an aluminum-based metal, a silver-based metal, or a copper-based metal having low resistivity, and an upper layer including a refractory metal such as molybdenum, chromium, tantalum, titanium, and/or the like.

The connection wiring EW may include a lower layer EWa, a middle layer EWb, and an upper layer EWc. For example, the lower layer EWa of the connection wiring EW may include titanium, the middle layer EWb may include aluminum, and the upper layer EWc may include titanium. The middle layer EWb may be disposed on the lower layer EWa of the connection wiring EW, and the upper layer EWc may be disposed on the middle layer EWb. For example, the middle layer EWb of the connection wiring EW may be disposed between the lower layer EWa and the upper layer EWc. The lower layer EWa of the connection wiring EW may be in contact with the drain electrode D1 of the transistor TR. A width of the middle layer EWb of the connection wiring EW may be narrower than a width of the lower layer EWa and a width of the upper layer EWc. Referring to an end of the connection wiring EW, end portions of the lower layer EWa, the middle layer EWb, and the upper layer EWc may coincide with each other. Referring to another end of the connection wiring EW, an end portion of at least one of the lower layer EWa, the middle layer EWb, and the upper layer EWc may not match. An end portion of the middle layer EWb may be disposed more inward than an end portion of the lower layer EWa and an end portion of the upper layer EWc. For example, the end portion of the lower layer EWa and the end portion of the upper layer EWc may protrude more than the end portion of the middle layer EWb.

A fifth insulating layer 182 (also referred to as a second planarization layer) may be disposed on the fifth conductive layer. The fifth insulating layer 182 may include an organic insulating material such as a general-purpose polymer such as poly(methyl methacrylate) or polystyrene, a polymer derivative with a phenol-based group, an acryl-based polymer, an imide-based polymer, a siloxane-based polymer, and/or the like. The fifth insulating layer 182 may be referred to as a second organic insulating layer.

An opening OP may be formed in the fifth insulating layer 182. The opening OP of the fifth insulating layer 182 may overlap at least a portion of the connection wiring EW. An end of the connection wiring EW may be covered by the fifth insulating layer 182, and another end of the connection wiring EW may not be covered by the fifth insulating layer 182 and may be exposed by the opening OP. Referring to the another end of the connection wiring EW exposed by the opening OP, an end portion of the lower layer EWa and an end portion of the upper layer EWc may protrude more than an end portion of the middle layer EWb.

A sixth conductive layer (also referred to as a pixel conductive layer) including a first electrode E1 may be disposed on the fifth insulating layer 182. Components included in the sixth conductive layer may be formed of the same material in the same process. The first electrode E1 may be the anode of the light emitting device ED. The first power voltage ELVDD may be applied to the first electrode E1. The first electrode E1 may be a portion of the first power voltage line VL1 or may be electrically connected to the first power voltage line VL1. The first power voltage line VL1 may be included in the sixth conductive layer or may be included in the above-described conductive layer such as the fifth conductive layer, the fourth conductive layer, or the like. The sixth conductive layer may be formed of a reflective conductive material or a translucent conductive material, or may be formed of a transparent conductive material. The sixth conductive layer may include a transparent conductive material such as indium-tin oxide (ITO) or indium-zinc oxide (IZO). The sixth conductive layer may include a metal such as lithium (Li), calcium (Ca), aluminum (Al), silver (Ag), magnesium (Mg), or gold (Au) or a metal alloy. The sixth conductive layer may be a multilayer. For example, the sixth conductive layer may have a triple layer structure such as ITO-silver (Ag)-ITO.

The aforementioned wirings GL1, DL, VL1, and VL2 may be included in the first conductive layer, the second conductive layer, the third conductive layer, the fourth conductive layer, the fifth conductive layer, and/or the sixth conductive layer.

A pixel defining layer 190 (also referred to as a partition wall or a bank) may be disposed on the fifth insulating layer 182 and the first electrode E1. The pixel defining layer 190 may have a first opening O1 overlapping the first electrode E1. The first opening O1 of the pixel defining layer 190 may correspond to a light emitting area of the light emitting device ED. The first opening O1 may overlap a central portion of the first electrode E1, and may not overlap an edge portion of the first electrode E1. Accordingly, a size of the first opening O1 may be smaller than a size of the first electrode E1. The pixel defining layer 190 may further have a second opening O2 overlapping the opening OP of the fifth insulating layer 182. A size of the second opening O2 of the pixel defining layer 190 may be greater than a size of the opening OP of the fifth insulating layer 182. The second opening O2 of the pixel defining layer 190 may have a shape surrounding the opening OP of the fifth insulating layer 182. The pixel defining layer 190 may include an organic insulating material such as a general-purpose polymer such as poly(methyl methacrylate) or polystyrene, a polymer derivative with a phenol-based group, an acryl-based polymer, an imide-based polymer, a siloxane-based polymer, and/or the like. The pixel defining layer 190 may include a positive type photosensitive resin. A side surface of the pixel defining layer 190 may have a tapered shape at a portion where the first opening O1 and the second opening O2 of the pixel defining layer 190 are formed. For example, the first opening O1 and the second opening O2 may have a shape in which a width of the first opening O1 and a width of the second opening O2 are gradually widened as the first opening O1 and the second opening O2 move away from the substrate 110 along the third direction z.

Auxiliary wiring AW may be disposed on the pixel defining layer 190, and a separator pattern (or a separation pattern) SP may be disposed on the auxiliary wiring AW. For example, the auxiliary wiring AW may be disposed between the pixel defining layer 190 and the separator pattern SP. The auxiliary wiring AW and the separator pattern SP may overlap each other. The auxiliary wiring AW and the separator pattern SP may have a shape surrounding the light emitting device ED in a plan view. The light emitting devices ED of adjacent pixels PX may be divided by the auxiliary wiring AW and the separator pattern SP. A width of the separator pattern SP may be greater than a width of the auxiliary wiring AW.

The auxiliary wiring AW may include an oxide semiconductor such as IGZO, zinc oxide (ZnO), indium oxide ($In_2O_3$), ITO, tungsten oxide ($WO_3$), gallium oxide ($Ga_2O_3$), and/or the like. The auxiliary wiring AW may be formed of a hydrophilic material. The first power voltage ELVDD may be applied to the auxiliary wiring AW according to an embodiment. However, the disclosure is not limited thereto, and a different voltage may be applied to the auxiliary wiring AW. A constant DC power voltage may be applied to the auxiliary wiring AW. In an embodiment, the auxiliary wiring AW may be floating. The auxiliary wiring AW may have a characteristic of a conductor or a nonconductor according to an oxygen content of the oxide semiconductor.

The separator pattern SP may include an organic insulating material. The separator pattern SP may include a negative type photosensitive resin. Side surfaces of both ends of the separator pattern SP may have a reverse tapered shape. For example, the separator pattern SP may have a shape in which a width of the separator pattern SP is gradually widened as the separator pattern SP moves away from the substrate 110 in the third direction z. A lower portion of the separator pattern SP in contact with the auxiliary wiring AW may have a width that is similar to that of the auxiliary wiring AW. An upper portion of the separator pattern SP separated from the auxiliary wiring AW may have a width that is wider than that of the auxiliary wiring AW.

An intermediate layer EL may be disposed on the first electrode E1 and the pixel defining layer 190. The intermediate layer EL may include the light emitting layer EML and a functional layer FL.

The light emitting layer EML may be a layer in which electro-optical conversion is performed through a recombination of an electron and a hole, and may include an organic material and/or an inorganic material that emits light of a predetermined or selected color. The light emitting layer EML may be disposed in the first opening O1 of the pixel defining layer 190 and may overlap the first electrode E1. In an embodiment, a portion of the light emitting layer EML may also be disposed at a side surface and an upper surface of the pixel defining layer 190. The light emitting layer EML may be disposed at an upper surface of the pixel defining layer 190 adjacent to the first opening OP.

The functional layer FL may include at least one of a hole injection layer HIL, a hole transport layer HTL, an electron transport layer ETL, and an electron injection layer (not shown). The functional layer FL may be divided as a first functional layer FL1 disposed between the first electrode E1 and the light emitting layer EML and a second functional layer FL2 disposed between the light emitting layer EML and a second electrode E2. The first functional layer FL1 may include the hole injection layer HIL and/or the hole transport layer HTL. The second functional layer FL2 may include the electron transport layer ETL and/or the electron injection layer (not shown). The functional layer FL may be disposed in an entire display area DA. The functional layer FL may be disposed not only in the first opening O1 of the pixel defining layer 190 but also outside the first opening O1.

The functional layer FL may be disconnected by the connection wiring EW in the second opening O2 of the pixel defining layer 190 and the opening OP of the fifth insulating layer 182. As described above, referring to the other end of the connection wiring EW exposed by the opening OP, an end portion of the lower layer EWa and an end portion of the upper layer EWc may protrude more than an end portion of the middle layer EWb. Therefore, a cave structure in which the middle layer EWb does not exist may be formed below the end portion of the upper layer EWc of the connection wiring EW, and the functional layer FL may be disposed inside a cave. A portion of the functional layer FL disposed inside the cave may not be connected to a portion of the functional layer FL disposed on the upper layer EWc of the connection wiring EW, and may be disconnected.

The functional layer FL may be disconnected by the separator pattern SP. As described above, the separator pattern SP may have a reverse tapered shape. A cave structure may be formed under the separator pattern SP, and the functional layer FL may be disposed inside a cave. A portion of the functional layer FL disposed inside the cave may not be connected to a portion of the functional layer FL disposed on the separator pattern SP, and may be disconnected. The auxiliary wiring AW disposed below the separator pattern SP may have a narrower width than the separator pattern SP, and may be spaced apart from the functional layer FL disposed inside the cave by a predetermined or selected distance. For example, the auxiliary wiring AW may not be connected to the functional layer FL.

As described above, the functional layer FL may be disconnected by the connection wiring EW, and may be disconnected by the separator pattern SP. Adjacent functional layers FL that are disconnected by the separator pattern SP may not be connected to each other at all, and may be completely separated. Adjacent functional layers FL disconnected by the connection wiring EW may be connected to each other in a region except for the connection wiring EW. For example, a disconnection of the functional layer FL by the separator pattern SP may be for separation between adjacent pixels (PXa, PXb, and PXc (refer to FIG. 5)) and separation between the display area DA and the peripheral area PA, and a disconnection of the functional layer FL by the connection wiring EW may be for a connection between the second electrode E2 and the connection wiring EW.

The second electrode E2 may be disposed on the functional layer FL. The second electrode E2 may constitute the light emitting device ED such as an organic light emitting diode or an inorganic light emitting diode together with the first electrode E1 and the intermediate layer EL. The first electrode E1 may be an anode of the light emitting device ED, and the second electrode E2 may be a cathode of the light emitting device ED. As with the functional layer FL, the second electrode E2 may be disposed in an entire display area DA. The second electrode E2 may be disposed not only in the first opening O1 of the pixel defining layer 190 but also outside the first opening O1.

The second electrode E2 may be disconnected by the connection wiring EW in the second opening O2 of the pixel defining layer 190 and the opening OP of the fifth insulating layer 182. As described above, a cave structure may be formed below an end portion of the upper layer EWc of the connection wiring EW, and the second electrode E2 may be disposed inside a cave. A portion of the second electrode E2 disposed inside the cave may not be connected to a portion of the second electrode E2 disposed on the upper layer EWc of the connection wiring EW, and may be disconnected. In the cave, the second electrode E2 may be connected to the connection wiring EW. Accordingly, the second electrode E2 may be electrically connected to the drain electrode D1 of the transistor TR through the connection wiring EW. The second electrode E2 may be in contact with a side surface of the middle layer EWb of the connection wiring EW. The second electrode E2 may also be in contact with an upper surface of the lower layer EWa of the connection wiring EW. In the cave, the second electrode E2 may cover a side surface of an end portion of the functional layer FL. The second electrode E2 disposed on the upper layer EWc of the connection wiring EW may be in contact with an upper surface of an end portion of the upper layer EWc. Above the upper layer EWc of the connection wiring EW, the second electrode E2 may cover a side surface of an end portion of the functional layer FL.

The second electrode E2 may be disconnected by the separator pattern SP. As described above, the separator pattern SP may have a reverse tapered shape, and the second electrode E2 may be disposed inside a cave structure formed under the separator pattern SP. A portion of the second electrode E2 disposed inside the cave may not be connected to a portion of the second electrode E2 disposed on the separator pattern SP, and may be disconnected. In the cave, the second electrode E2 may cover a side surface of an end portion of the functional layer FL. The auxiliary wiring AW disposed below the separator pattern SP may have a narrower width than the separator pattern SP, and may be spaced apart from the second electrode E2 disposed inside the cave by a predetermined or selected distance. For example, the auxiliary wiring AW may not be connected to the second electrode E2. Accordingly, second electrodes E2 of adjacent pixels PX may not be electrically connected by the auxiliary wiring AW and the separator pattern SP, but may be separated.

As described above, the second electrode E2 may be disconnected by the connection wiring EW, and may be disconnected by the separator pattern SP. Adjacent second electrodes E2 that are disconnected by the separator pattern SP may not be connected to each other at all, and may be completely separated. Adjacent second electrodes E2 disconnected by the connection wiring EW are connected to each other in a region except for the connection wiring EW. For example, a disconnection of the second electrodes E2 by the separator pattern SP may be for separation between adjacent pixels (PXa, PXb, and PXc) and separation between the display area DA and the peripheral area PA, and a disconnection of the second electrodes E2 by the connection wiring EW may be for a connection between the second electrode E2 and the middle layer EWb of the connection wiring EW.

The second electrode E2 may have light transmittance by forming a thin layer of a metal or a metal alloy having a low work function such as calcium (Ca), barium (Ba), magnesium (Mg), aluminum (Al), silver (Ag), and/or the like. The second electrode E2 may include a transparent conductive oxide such as indium-tin oxide (ITO) and indium-zinc oxide (IZO).

A capping layer (not shown) may be disposed on the second electrode E2. The capping layer may improve light efficiency by adjusting a refractive index. An encapsulation layer (not shown) may be disposed on the capping layer. The encapsulation layer may encapsulate the light emitting device ED to prevent moisture or oxygen from penetrating from the outside. The encapsulation layer may be a thin film encapsulation layer including at least one inorganic layer and at least one organic layer. The encapsulation layer may be provided in a form of a substrate so that the substrate is bonded to the substrate 110. A touch sensor layer (not shown) may be disposed on the encapsulation layer, and an anti-reflection layer (not shown) for reducing reflection of external light may be disposed on the touch sensor layer.

The display device according to an embodiment may include multiple pixels PX. Hereinafter, an arrangement form of the pixels PX disposed in the display area DA of the display device according to an embodiment will be described with reference to FIG. 5.

Figure 5:
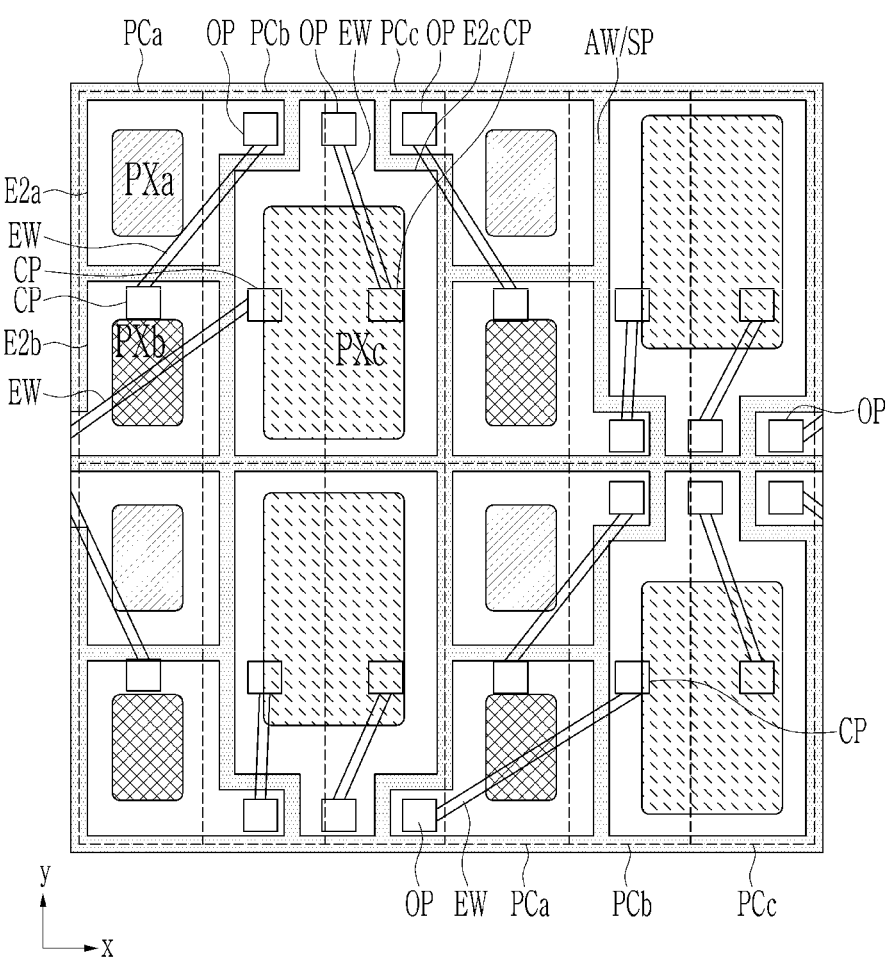
FIG. 5 is a plan view schematically illustrating the display device according to an embodiment.

FIG. 5 is a plan view schematically illustrating the display device according to an embodiment. FIG. 5 illustrates the pixels PX disposed in the display area DA of the display device according to an embodiment.

As shown in FIG. 5, the display device according to an embodiment may include the pixels PXa, PXb, and PXc. Each of the pixels PXa, PXb, and PXc may include a light emitting portion and a non-light emitting portion, and the light emitting portion may correspond to a region in which the first opening O1 is formed in FIG. 4. The pixels PXa, PXb, and PXc may include a first pixel PXa, a second pixel PXb, and a third pixel PXc. Although FIG. 5 illustrates 12 pixels, the 12 pixels represent some pixels, and the pixels PXa, PXb, and PXc may be regularly disposed in a matrix direction in the display area DA. In an embodiment illustrated in FIG. 5, the first pixel PXa and the second pixel PXb may be alternately disposed in the second direction y in an odd-numbered column, and third pixels PXc may be disposed in the second direction y in an even-numbered column. The arrangement form of the pixels PXa, PXb, and PXc is not limited thereto, and may be variously changed.

The first pixel PXa, the second pixel PXb, and the third pixel PXc may display different colors, and may respectively display one of basic colors. For example, one of the first pixel PXa, the second pixel PXb, and the third pixel PXc may display red, another one of the first pixel PXa, the second pixel PXb, and the third pixel PXc may display green, and remaining one of the first pixel PXa, the second pixel PXb, and the third pixel PXc may display blue. For example, the first pixel PXa may display red, the second pixel PXb may display green, and the third pixel PXc may display blue. A planar size of the first pixel PXa may be similar to a planar size of the second pixel PXb. An area of the third pixel PXc may be larger than an area of the first pixel PXa or an area of the second pixel PXb. Colors and sizes of the first pixel PXa, the second pixel PXb, and the third pixel PXc are not limited thereto, and may be variously changed.

The first pixel PXa, the second pixel PXb, or the third pixel PXc may include the first electrode (not shown) and second electrodes E2a, E2b, and E2c. As described above, the second electrodes E2a, E2b, and E2c of each of the pixels PXa, PXb, and PXc may be separated from each other by the separator pattern SP.

The separator patterns SP may be connected to each other to be integrally formed. For example, the separator patterns SP may not be separated. For example, the separator pattern SP disposed between the first pixel PXa and the second pixel PXb, the separator pattern SP disposed between the second pixel PXb and the third pixel PXc, and the separator pattern SP disposed between the first pixel PXa and the third pixel PXc may be connected to each other. Likewise, the auxiliary wiring AW disposed under the separator pattern SP may not be separated but may be integrally formed by being connected to each other. For example, the auxiliary wiring AW disposed between the first pixel PXa and the second pixel PXb, the auxiliary wiring AW disposed between the second pixel PXb and the third pixel PXc, and the auxiliary wiring AW disposed between the first pixel PXa and the third pixel PXc may be connected to each other.

Each of the pixels PXa, PXb, and PXc may include the light emitting device and pixel driving circuits PCa, PCb, and PCc connected to the light emitting device. A rectangular area indicated by a dotted line in FIG. 5 may be one of areas of the pixel driving circuits PCa, PCb, and PCc. Areas in which the pixel driving circuits PCa, PCb, and PCc are disposed may not match light emitting areas of each of the pixel PXa, PXb, and PXc to increase the light emitting areas of each of the pixels PXa, PXb, and PXc. For example, a first pixel driving circuit PCa of the first pixel PXa, a second pixel driving circuit PCb of the second pixel PXb, and a third pixel driving circuit PCc of the third pixel PXc may be alternately disposed along the first direction x. As described above, since the light emitting areas do not match the areas of the pixel driving circuits PCa, PCb, and PCc, connection wiring EW may be appropriately disposed to efficiently secure the light emitting area. An end of the connection wiring EW may be connected to the drain electrode D1 of the transistor TR. A connection part CP between the drain electrode D1 of the transistor TR of each of the pixel driving circuits PCa, PCb, and PCc and the connection wiring EW may be arranged in a line at a predetermined or selected interval along the first direction x at an approximate center of each of the pixel driving circuits PCa, PCb, and PCc. Another end of the connection wiring EW may be connected to the second electrodes E2a, E2b, and E2c of each of the pixels PXa, PXb, and PXc within the opening OP of the fifth insulating layer 182. A connection part between the second electrodes E2a, E2b, and E2c of each of the pixels PXa, PXb, and PXc and the connection wiring EW may be disposed in a line at a predetermined or selected interval along the first direction x at an upper side or a lower side of the third pixel PXc. However, a position of the connection wiring EW, a position of the connection part CP between the connection wiring EW and each of the pixel driving circuits PCa, PCb, and PCc, a position of the connection part between the connection wiring EW and the second electrode E2a, E2b, or E2c, and the like are not limited thereto, and may be variously changed.

The auxiliary wiring AW of the display device according to an embodiment may be disposed to extend to the peripheral area PA. Hereinafter, the auxiliary wiring AW disposed in the peripheral area PA of the display device according to an embodiment will be described with reference to FIGS. 6 and 7.

Figure 6:
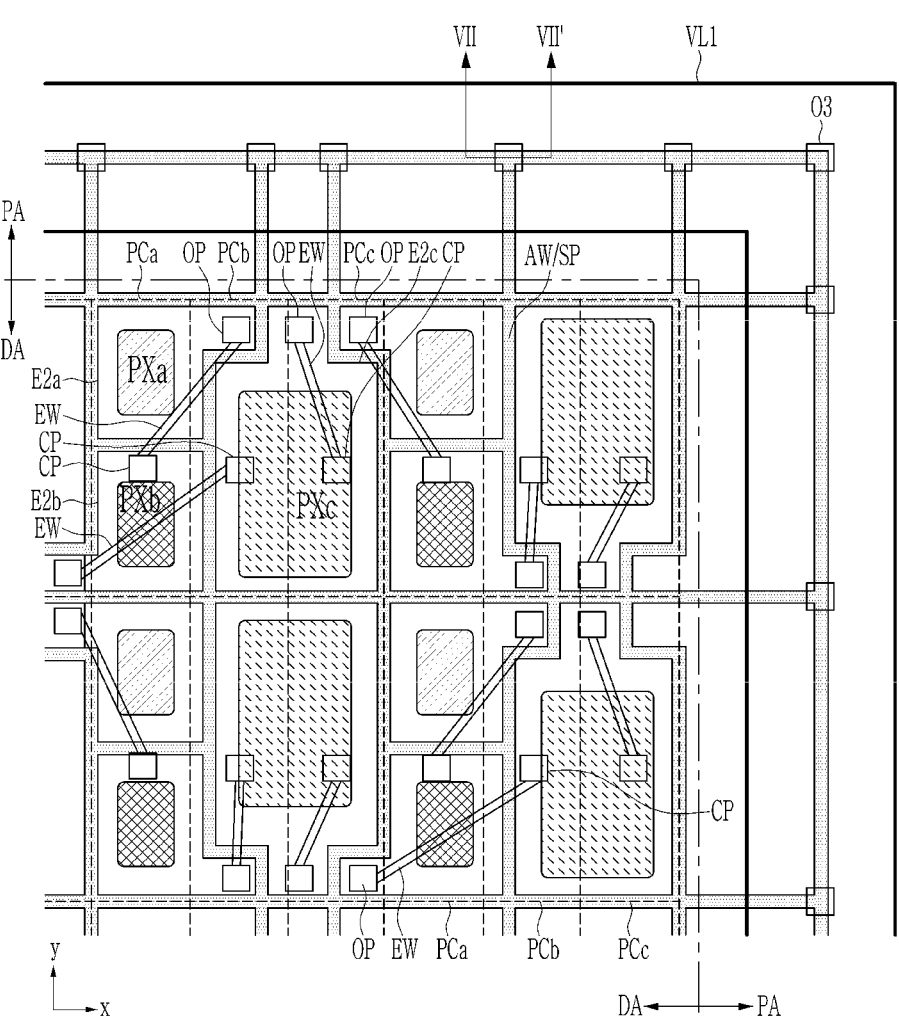
FIG. 6 is a plan view schematically illustrating the display device according to an embodiment.
Figure 7:
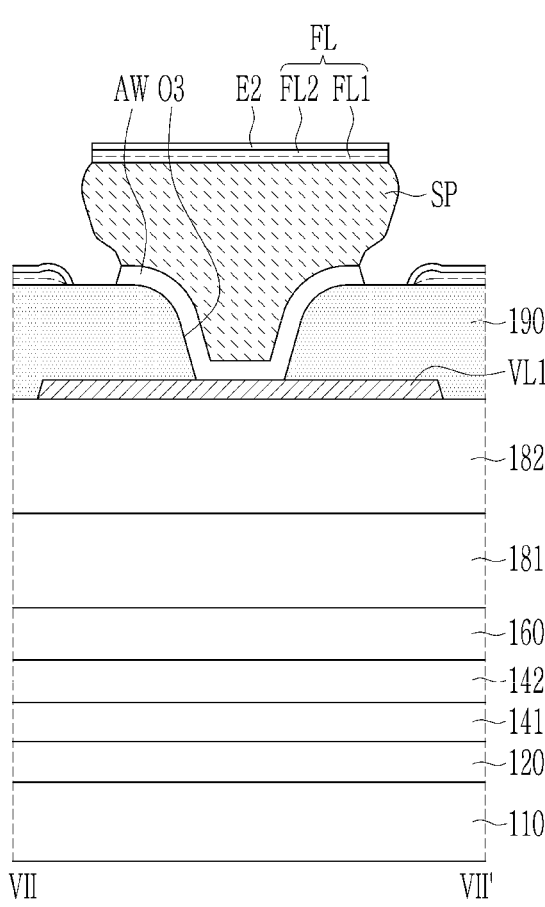
FIG. 7 is a schematic cross-sectional view of the display device taken along line VII-VII' of FIG. 6.

FIG. 6 is a plan view schematically illustrating the display device according to an embodiment. FIG. 7 is a schematic cross-sectional view of the display device taken along line VII-VII' of FIG. 6. FIG. 6 illustrates the display area DA of the display device and the peripheral area PA adjacent to the display area DA according to an embodiment.

As shown in FIG. 6 and FIG. 7, the display device according to an embodiment may include the auxiliary wiring AW that is disposed in the display area DA and the peripheral area PA. In the display area DA, the auxiliary wiring AW may extend in the first direction x and the second direction y to have a net shape. The auxiliary wiring AW may be disposed to surround all pixels PXa, PXb, and PXc along an edge of the display area DA. Accordingly, the second electrodes E2a, E2b, and E2c disposed in the display area DA may be disconnected from the second electrode E2 in the peripheral area PA.

Referring to the peripheral area PA of the display device according to an embodiment, the peripheral area PA may include the substrate 110, the insulating layers 120, 141, 142, 160, 181, and 182, and the first power voltage line VL1 disposed on the fifth insulating layer 182. Some of the insulating layers 120, 141, 142, 160, 181, and 182 disposed in the display area DA may be omitted in the peripheral area PA. The first power voltage line VL1 may be disposed on the fifth insulating layer 182 and may be included in the sixth conductive layer. However, a position of the first power voltage line VL1 is not limited thereto, and may be variously changed. The first power voltage line VL1 may transmit the first power voltage ELVDD. The first power voltage line VL1 may be disposed in the peripheral area PA, and may have a shape surrounding the display area DA in a plan view. The first power voltage line VL1 may extend in the first direction x and the second direction y.

The pixel defining layer 190 may be disposed on the first power voltage line VL1 and the fifth insulating layer 182. The pixel defining layer 190 may have a third opening O3 overlapping the first power voltage line VL1. The third opening O3 of the pixel defining layer 190 may overlap the auxiliary wiring AW. The auxiliary wiring AW may be connected to the first power voltage line VL1 in the third opening O3. The auxiliary wiring AW may be disposed directly above the first power voltage line VL1 in the third opening O3. Accordingly, the auxiliary wiring AW may receive the first power voltage ELVDD through the first power voltage line VL1. In the peripheral area PA, the auxiliary wiring AW may have a shape that overlaps the first power voltage line VL1 and surrounds the display area DA. The auxiliary wiring AW may have a bridge shape for connecting a portion disposed in the display area DA to a portion overlapping the first power voltage line VL1. The auxiliary wiring AW disposed in the display area DA and the auxiliary wiring AW disposed in the peripheral area PA may be integrally formed by being connected to each other.

Although it has been described above that the auxiliary wiring AW is connected to the first power voltage line VL1, the disclosure is not limited thereto. In an embodiment, the auxiliary wiring AW may not be connected to another wiring, and may be in a floating state. As described above, the auxiliary wiring AW may be disposed in a net shape in the display area DA. The net shape may surround a periphery of each pixel PX. Accordingly, in case that the auxiliary wiring AW is in a floating state, there may be a concern that the light emitting device ED of each pixel PX is adversely affected. In the display device according to an embodiment, since the auxiliary wiring AW is connected to the first power voltage line VL1 to apply a constant voltage, the light emitting device ED may be stably driven.

The auxiliary wiring AW may be connected to another wiring instead of the first power voltage line VL1. For example, the auxiliary wiring AW may be connected to the second power voltage line VL2 to receive the second power voltage ELVSS. This is only an example, and the auxiliary wiring AW may be connected to wiring to which another DC voltage is applied.

The separator pattern SP may be disposed on the auxiliary wiring AW. The separator pattern SP may overlap the auxiliary wiring AW. Side surfaces of both ends of the separator pattern SP may have a reverse tapered shape. Like the auxiliary wiring AW, the separator pattern SP may extend in the first direction x and the second direction y. The separator pattern SP may have a net shape in the display area DA, and may have a shape surrounding the display area DA in the peripheral area PA. A width of the auxiliary wiring AW may be substantially the same as a width of a lower portion of the separator pattern SP.

The functional layer FL may be disposed on the pixel defining layer 190 and the separator pattern SP, and the second electrode E2 may be disposed on the functional layer FL. The functional layer FL and the second electrode E2 may be disconnected by the separator pattern SP. A portion of the functional layer FL disposed on the separator pattern SP and a portion of the functional layer FL disposed around the separator pattern SP may not be connected to each other, and may be disconnected. Likewise, a portion of the second electrode E2 disposed on the separator pattern SP and a portion of the second electrode E2 disposed around the separator pattern SP may not be connected to each other, but may be disconnected. The functional layer FL and the second electrode E2 may not be connected to the auxiliary wiring AW.

Next, a method for manufacturing the display device according to an embodiment will be described with reference to FIGS. 8 to 15.

FIG. 8 through FIG. 15 are process cross-sectional views schematically illustrating the method for manufacturing the display device according to an embodiment.

Figure 8:
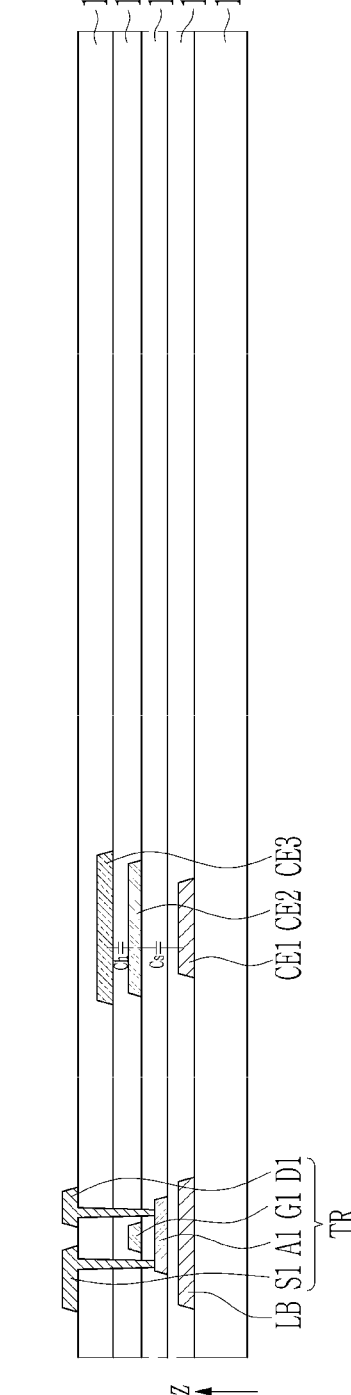
FIG. 8 through FIG. 15 are process cross-sectional views schematically illustrating a method for manufacturing a display device according to an embodiment.

First, as shown in FIG. 8, a conductive material layer may be formed on the substrate 110 and the formed conductive material layer may be patterned so that the first conductive layer including the light blocking layer LB, the first capacitor electrode CE1, and the like is formed. Patterning may mean forming a predetermined or selected pattern by removing a portion of a layer through a photo and etching process and the like. The buffer layer 120 may be formed on the first conductive layer. A semiconductor material layer may be formed on the buffer layer 120 and the formed semiconductor material layer may be patterned so that the semiconductor layer A1 is formed. The first insulating layer 141 may be formed on the semiconductor layer A1. A conductive material layer may be formed on the first insulating layer 141 and the formed conductive material layer may be patterned so that the second conductive layer including the gate electrode G1, the second capacitor electrode CE2, and the like is formed. The second insulating layer 142 may be formed on the second conductive layer. A conductive material layer may be formed on the second insulating layer 142 and the formed conductive material layer may be patterned so that the third conductive layer including the third capacitor electrode CE3 and the like is formed. The third insulating layer 160 may be formed on the third conductive layer. A conductive material layer may be formed on the third insulating layer 160 and the formed conductive material layer may be patterned so that the fourth conductive layer including the source electrode S1, the drain electrode D1, and the like is formed.

Figure 9:
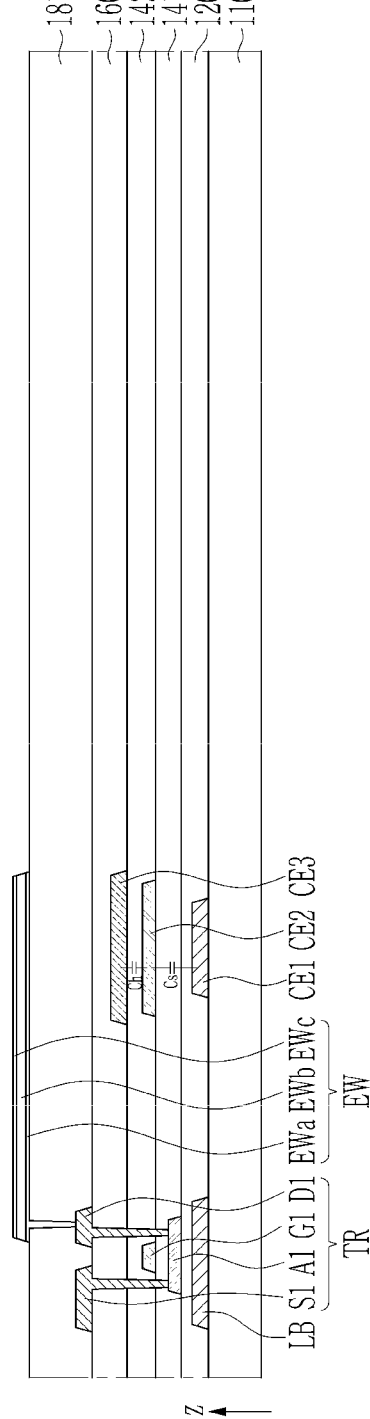

As shown in FIG. 9, the fourth insulating layer 181 may be formed on the fourth conductive layer, and a contact hole overlapping the drain electrode D1 may be formed by patterning the fourth insulating layer 181. A conductive material layer may be formed on the fourth insulating layer 181 and the formed conductive material layer may be patterned so that the fifth conductive layer including the connection wiring EW and the like is formed. The connection wiring EW may be connected to the drain electrode D1 through the contact hole formed in the fourth insulating layer 181.

The connection wiring EW may include the lower layer EWa, the middle layer EWb, and the upper layer EWc. For example, the lower layer EWa of the connection wiring EW may include titanium, the middle layer EWb may include aluminum, and the upper layer EWc may include titanium. The middle layer EWb may be disposed on the lower layer EWa of the connection wiring EW, and the upper layer EWc may be disposed on the middle layer EWb. For example, the middle layer EWb of the connection wiring EW may be disposed between the lower layer EWa and the upper layer EWc. The lower layer EWa of the connection wiring EW may be in contact with the drain electrode D1 of the transistor TR. A width of the lower layer EWa, a width of the middle layer EWb, and a width of the upper layer EWc may be substantially the same. Referring to both ends of the connection wiring EW, end portions of the lower layer EWa, the middle layer EWb, and the upper layer EWc may coincide with each other.

Figure 10:
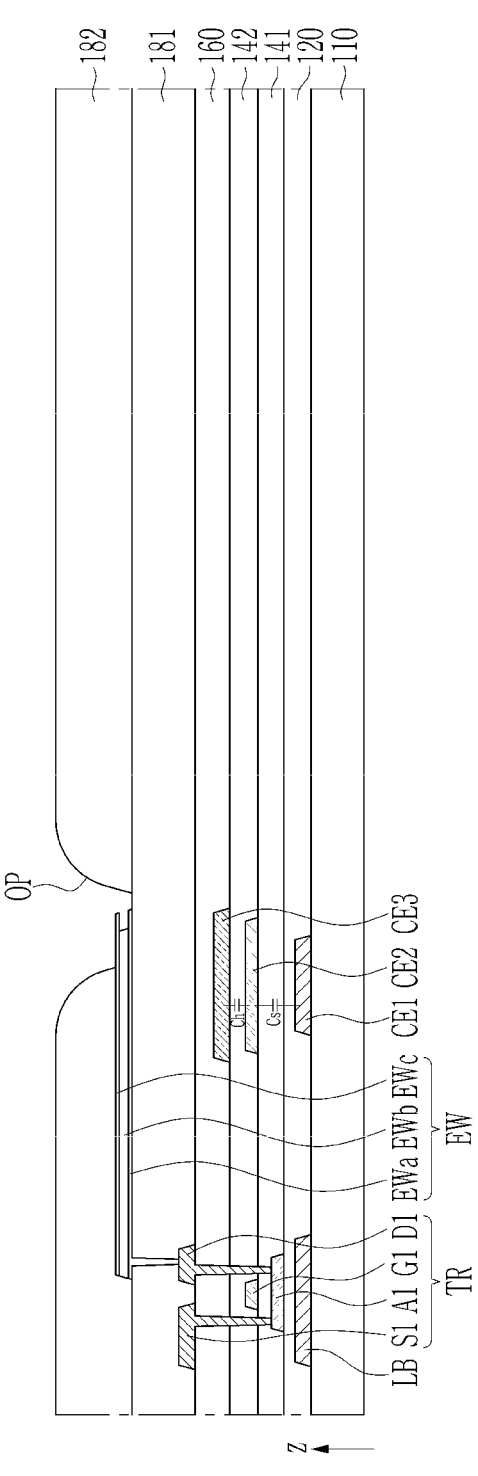

As shown in FIG. 10, the fifth insulating layer 182 may be formed on the fifth conductive layer, and the opening OP overlapping at least a portion of the connection wiring EW may be formed by patterning the fifth insulating layer 182. An end of the connection wiring EW may be covered by the fifth insulating layer 182, and the other end of the connection wiring EW may not be covered by the fifth insulating layer 182 and may be exposed by the opening OP. Another end of the connection wiring EW may be etched by supplying an etchant in a state where the another end of the connection wiring EW is exposed. The etchant capable of selectively etching the middle layer EWb of the connection wiring EW may be used. Accordingly, the middle layer EWb of the connection wiring EW may be etched, and the lower layer EWa and the upper layer EWc may not be etched. Referring to the another end of the connection wiring EW exposed by the opening OP after an etching process is performed, an end portion of at least one of the lower layer EWa, the middle layer EWb, and the upper layer EWc may not match. An end portion of the middle layer EWb may be disposed more inward than an end portion of the lower layer EWa and an end portion of the upper layer EWc. For example, the end portion of the lower layer EWa and the end portion of the upper layer EWc may protrude more than the end portion of the middle layer EWb.

Figure 11:
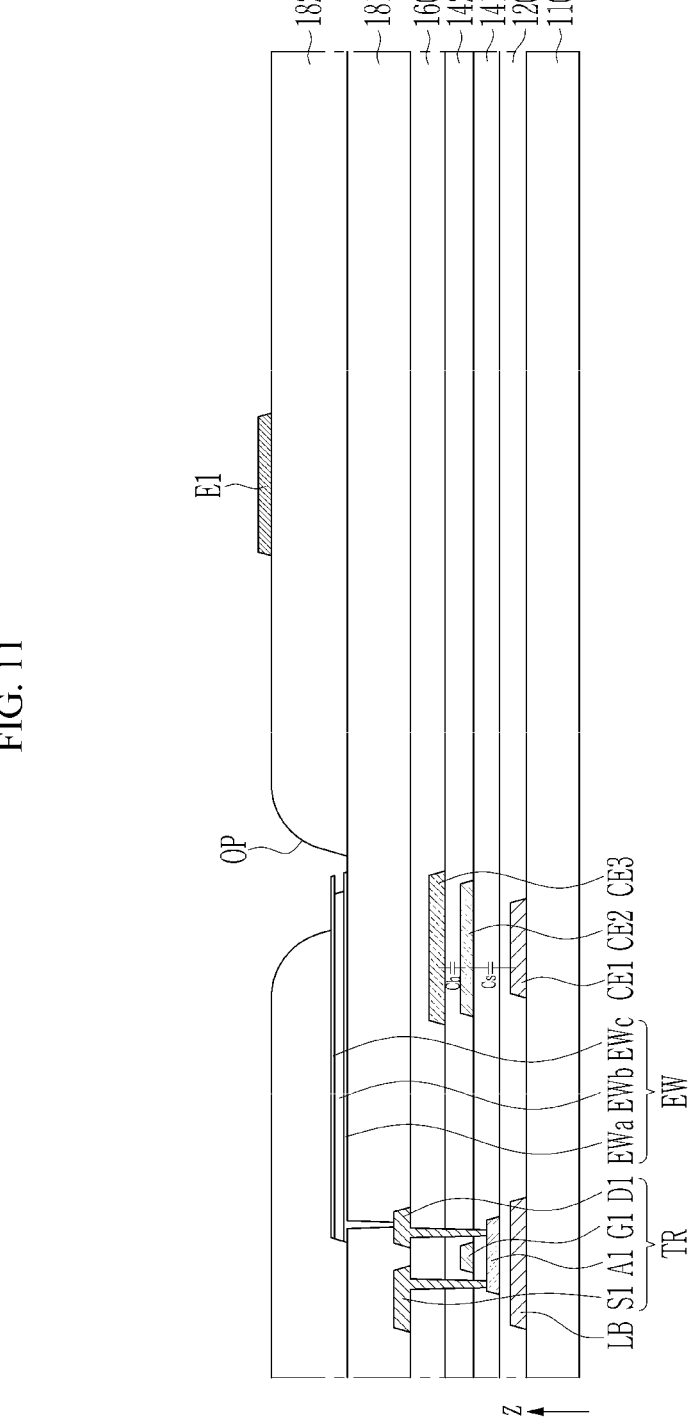

As shown in FIG. 11, a conductive material layer may be formed on the fifth insulating layer 182 and the formed conductive material layer may be patterned so that the sixth conductive layer including the first electrode E1 is formed. The first electrode E1 may be spaced apart from the connection wiring EW, and the first electrode E1 and the connection wiring EW may not be directly connected to each other.

In a step of forming the first electrode E1 in the display area DA, the first power voltage line VL1 may be formed in the peripheral area PA. The first power voltage line VL1 may be disposed on the same layer as the first electrode E1, and may include the same material as the first electrode E1. The first power voltage line VL1 may be spaced apart from the display area DA by a predetermined or selected interval, and may have a shape surrounding the display area DA.

Figure 12:
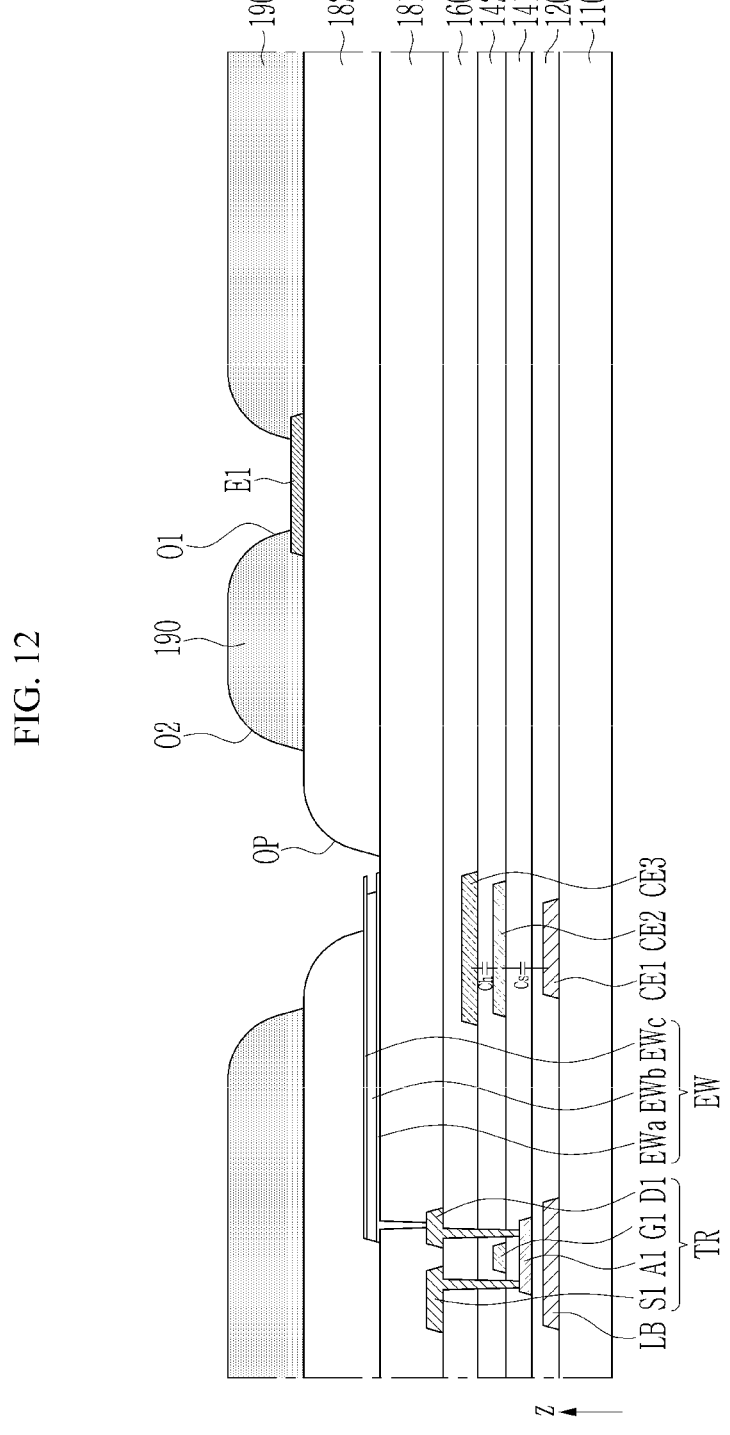

As shown in FIG. 12, the pixel defining layer 190 may be formed on the fifth insulating layer 182 and the first electrode E1, and the first opening O1 overlapping the first electrode E1 and the second opening O2 overlapping the opening OP of the fifth insulating layer 182 may be formed by patterning the pixel defining layer 190. The first opening O1 of the pixel defining layer 190 may overlap a central portion of the first electrode E1, and may not overlap an edge portion of the first electrode E1. Accordingly, a size of the first opening O1 may be smaller than a size of the first electrode E1, and an edge of the first electrode E1 may be covered by the pixel defining layer 190. A size of the second opening O2 of the pixel defining layer 190 may be greater than a size of the opening OP of the fifth insulating layer 182. The second opening O2 of the pixel defining layer 190 may have a shape surrounding the opening OP of the fifth insulating layer 182.

The pixel defining layer 190 may include an organic insulating material. The pixel defining layer 190 may include a positive type photosensitive resin. In a case of the positive type photosensitive resin, a portion irradiated with light in an exposure process may be removed by a developer. Accordingly, an upper portion of the pixel defining layer 190 to which relatively more light is irradiated may be removed relatively more than a lower portion of the pixel defining layer 190. Accordingly, a side surface of the pixel definition layer 190 corresponding to a portion where the first opening O1 and the second opening O2 of the pixel definition layer 190 are formed may have a tapered shape. For example, the first opening O1 and the second opening O2 may have a shape in which a width of the first opening O1 and a width of the second opening O2 are gradually widened as the first opening O1 and the second opening O2 move away from the substrate 110 along the third direction z.

The pixel defining layer 190 may be formed in the display area DA and the peripheral area PA. In the peripheral area PA, the pixel defining layer 190 may be disposed on the first power voltage line VL1 and the fifth insulating layer 182. In a step of forming the first opening O1 and the second opening O2 in the pixel defining layer 190, the third opening O3 may be formed in the pixel defining layer 190 disposed in the peripheral area PA. The third opening O3 of the pixel defining layer 190 may overlap the first power voltage line VL1, and at least a portion of an upper surface of the first power voltage line VL1 may be exposed by the third opening O3.

Figure 13:
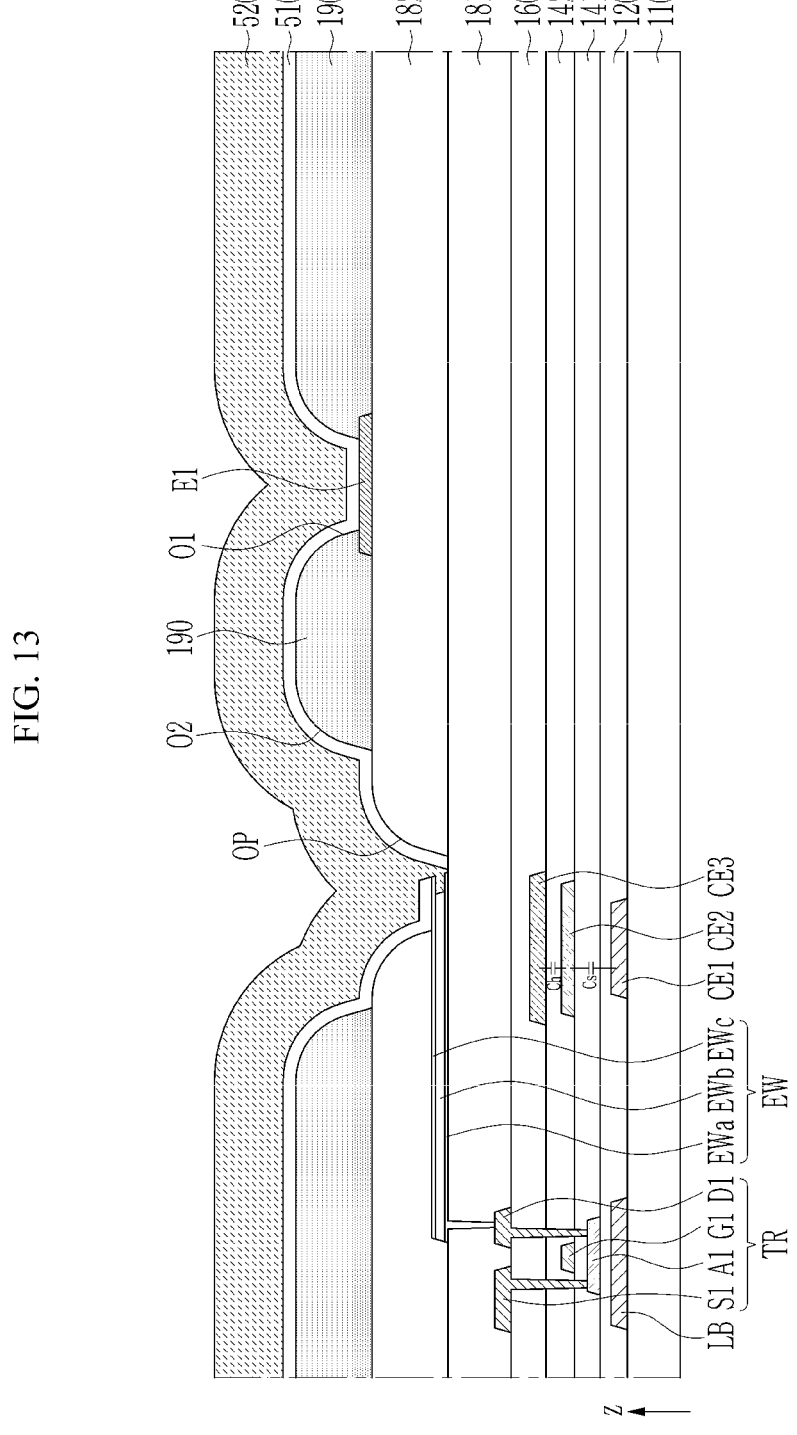

As shown in FIG. 13, a first material layer 510 and a second material layer 520 may be sequentially stacked on the pixel defining layer 190. The first material layer 510 and the second material layer 520 may be formed in the display area DA and the peripheral area PA. The first material layer 510 may be formed of a material that is etched using an etchant having a high selection ratio with respect to the sixth conductive layer, and may include, for example, an oxide semiconductor. This is to prevent damage to the sixth conductive layer in a process of etching the first material layer 510. The oxide semiconductor may include an oxide of a metal such as zinc (Zn), indium (In), gallium (Ga), tin (Sn), titanium (Ti), and/or the like, or a combination of the metal and the oxide of the metal. The oxide semiconductor may include at least one of indium-zinc oxide (IZO), indium-gallium-zinc oxide (IGZO), indium-zinc-tin oxide (IZTO), zinc-tin oxide (ZTO), and zinc oxide (ZnO). For example, the first material layer 510 may be an oxide semiconductor that includes indium-gallium-zinc oxide (IGZO). The oxide semiconductor may have a characteristic of a conductor or a nonconductor according to an oxygen content of the oxide semiconductor. The second material layer 520 may include an organic insulating material. The second material layer 520 may include a negative type photosensitive resin.

Figure 14:
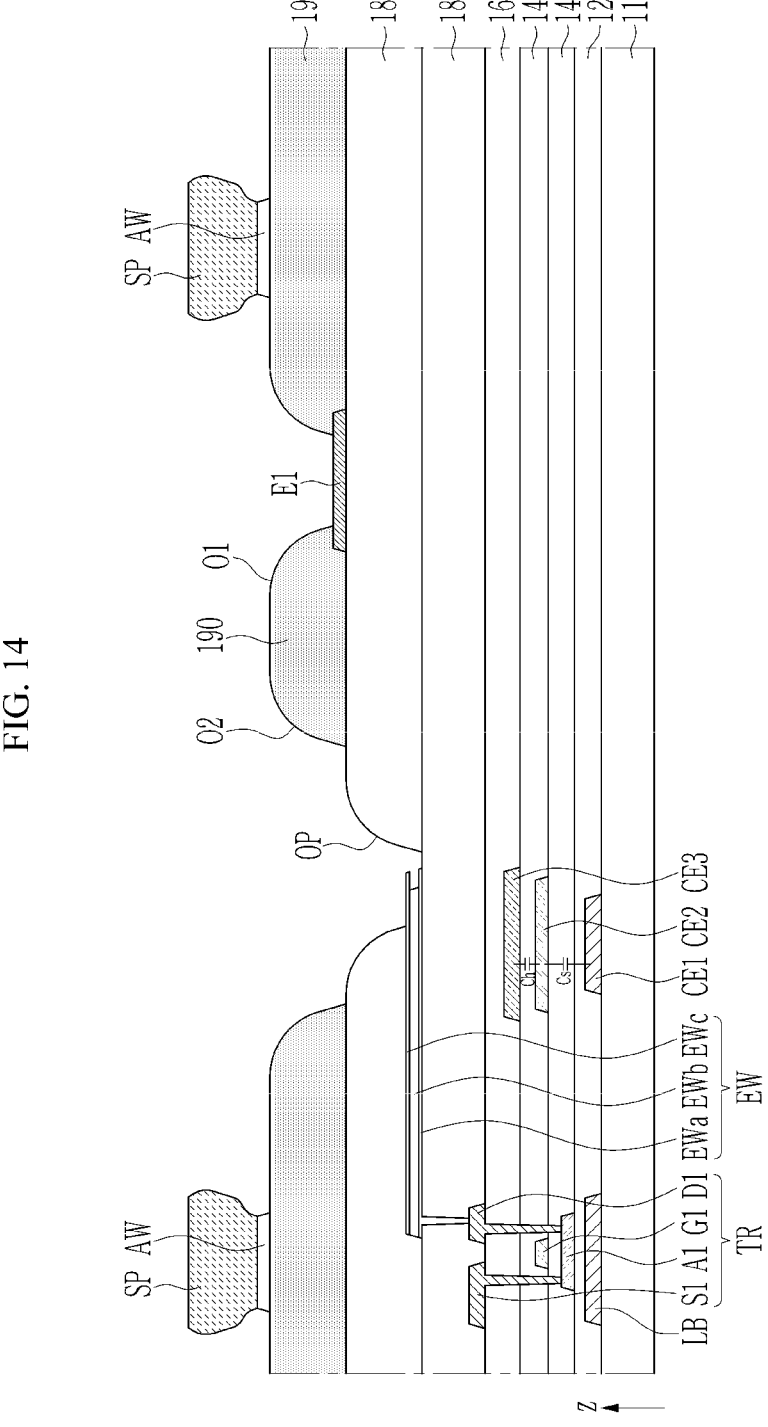

As shown in FIG. 14, the second material layer 520 may be patterned using a photo and etching process to form the separator pattern SP. The separator pattern SP may include a negative type photosensitive resin. In a case of the negative photosensitive resin, a portion in which light is not irradiated in an exposure process may be removed by a developer. Accordingly, a lower portion of the second material layer 520 to which relatively less light is irradiated may be removed relatively more than an upper portion of the second material layer 520. Accordingly, side surfaces of both ends of the separator pattern SP may have a reverse tapered shape. For example, the separator pattern SP may have a shape in which a width of the separator pattern SP is gradually widened as the separator pattern SP moves away from the substrate 110 along the third direction z.

Subsequently, an etching process is performed using the separator pattern SP as a mask. A wet etching process may be used. The first material layer 510 disposed below the separator pattern SP may be etched to form the auxiliary wiring AW. A portion of the first material layer 510 in contact with the separator pattern SP may remain, and the remaining portion may be removed. The auxiliary wiring AW may have a width that is similar to that of a lower portion of the separator pattern SP in contact with the auxiliary wiring AW. An upper portion of the separator pattern SP separated from the auxiliary wiring AW may have a width that is wider than that of the auxiliary wiring AW. The auxiliary wiring AW and the separator pattern SP may overlap each other. The auxiliary wiring AW and the separator pattern SP may have similar planar shapes.

The auxiliary wiring AW and the separator pattern SP may be formed in the display area DA and the peripheral area PA. The auxiliary wiring AW and the separator pattern SP may extend in the first direction x and the second direction y. The auxiliary wiring AW and the separator pattern SP may have a net shape in the display area DA, and may have a shape surrounding the display area DA in the peripheral area PA.

In the peripheral area PA, the auxiliary wiring AW and the separator pattern SP may overlap the first power voltage line VL1. The auxiliary wiring AW and the separator pattern SP may be formed in the third opening O3 of the pixel defining layer 190, and the auxiliary wiring AW may be connected to the first power voltage line VL1 in the third opening O3. Accordingly, the auxiliary wiring AW may receive the first power voltage ELVDD through the first power voltage line VL1.

Although it has been described above that the auxiliary wiring AW is connected to the first power voltage line VL1, the disclosure is not limited thereto. In an embodiment, the auxiliary wiring AW may not be connected to another wiring, and may be in a floating state. As described above, the auxiliary wiring AW is disposed in a net shape in the display area DA. The net shape may surround a periphery of each pixel PX. Accordingly, in case that the auxiliary wiring AW is in a floating state, there is a concern that the light emitting device ED is adversely affected. In the display device according to an embodiment, since the auxiliary wiring AW is connected to the first power voltage line VL1 to apply a constant voltage, the light emitting device ED may be stably driven.

The auxiliary wiring AW may be connected to another wiring instead of the first power voltage line VL1. For example, the auxiliary wiring AW may be connected to the second power voltage line VL2 to receive the second power voltage ELVSS. This is only an example, and the auxiliary wiring AW may be connected to wiring to which another DC voltage is applied.

Figure 15:
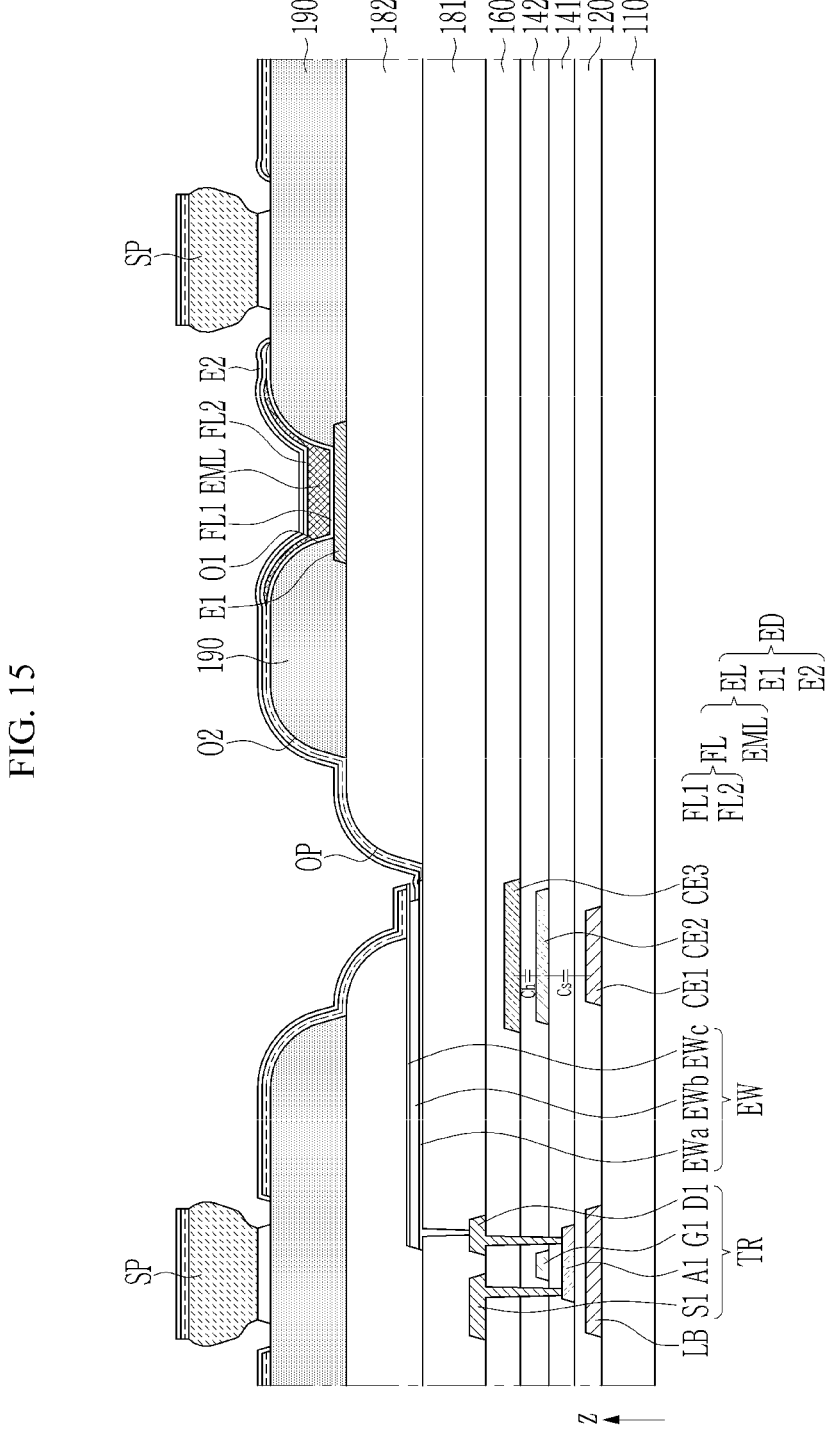

As shown in FIG. 15, the first functional layer FL1, the light emitting layer EML, and the second functional layer FL2 may be sequentially formed on the pixel defining layer 190 and the separator pattern SP. The first functional layer FL1 and the second functional layer FL2 may be entirely deposited using an open mask. As a result, the first functional layer FL1 and the second functional layer FL2 may be formed in an entire display area DA. Accordingly, the first functional layer FL1 and the second functional layer FL2 may be disposed in the first opening O1 and the second opening O2, and may also be disposed on the pixel defining layer 190 and the separator pattern SP. The light emitting layer EML may be formed to be disposed in the first opening O1 using a fine metal mask. The light emitting layer EML may be formed wider than the first opening O1 in consideration of a margin of a deposition process. Accordingly, a portion of the light emitting layer EML may be disposed on the pixel definition layer 190 outside the first opening O1. The light emitting layer EML may be disposed between the first functional layer FL1 and the second functional layer FL2 at a portion where the light emitting layer EML is formed. The second functional layer FL2 may be disposed directly above the first functional layer FL1 in a portion where the light emitting layer EML is not formed. The first functional layer FL1 and the second functional layer FL2 may constitute the functional layer FL. The functional layer FL and the light emitting layer EML may constitute the intermediate layer EL.

The functional layer FL may be disconnected by the connection wiring EW in the second opening O2 of the pixel defining layer 190 and the opening OP of the fifth insulating layer 182. As described above, referring to the other end of the connection wiring EW exposed by the opening OP, an end portion of the lower layer EWa and an end portion of the upper layer EWc may protrude more than an end portion of the middle layer EWb. Therefore, a cave structure in which the middle layer EWb does not exist may be formed below the end portion of the upper layer EWc of the connection wiring EW, and the functional layer FL may be disposed inside a cave. A portion of the functional layer FL disposed inside the cave may not be connected to a portion of the functional layer FL disposed on the upper layer EWc of the connection wiring EW, and may be disconnected.

The functional layer FL may be disconnected by the separator pattern SP. As described above, the separator pattern SP may have a reverse tapered shape. A cave structure may be formed under the separator pattern SP, and the functional layer FL may be disposed inside a cave. A portion of the functional layer FL disposed inside the cave may not be connected to a portion of the functional layer FL disposed on the separator pattern SP, and may be disconnected. The auxiliary wiring AW disposed below the separator pattern SP may have a narrower width than the separator pattern SP, and may be spaced apart from the functional layer FL disposed inside the cave by a predetermined or selected distance. For example, the auxiliary wiring AW may not be connected to the functional layer FL.

Subsequently, a conductive material layer may be deposited on the second functional layer FL2 to form the second electrode E2. The second electrode E2 may be entirely deposited using an open mask. As a result, the second electrode E2 may be formed in an entire display area DA.

The second electrode E2 may be disconnected by the connection wiring EW in the second opening O2 of the pixel defining layer 190 and the opening OP of the fifth insulating layer 182. As described above, a cave structure may be formed below an end portion of the upper layer EWc of the connection wiring EW, and the second electrode E2 may be disposed inside a cave. A portion of the second electrode E2 disposed inside the cave may not be connected to a portion of the second electrode E2 disposed on the upper layer EWc of the connection wiring EW, and may be disconnected. In the cave, the second electrode E2 may be connected to the connection wiring EW. Accordingly, the second electrode E2 may be electrically connected to the drain electrode D1 of the transistor TR through the connection wiring EW. The second electrode E2 may be in contact with a side surface of the middle layer EWb of the connection wiring EW. The second electrode E2 may also be in contact with an upper surface of the lower layer EWa of the connection wiring EW. In the cave, the second electrode E2 may cover a side surface of an end portion of the functional layer FL. For example, in case that the functional layer FL is deposited by an evaporation method and the second electrode E2 is deposited by a sputtering method, the second electrode E2 may be deposited wider than the functional layer FL. The second electrode E2 disposed on the upper layer EWc of the connection wiring EW may be in contact with an upper surface of an end portion of the upper layer EWc. Above the upper layer EWc of the connection wiring EW, the second electrode E2 may cover a side surface of an end portion of the functional layer FL.

The second electrode E2 may be disconnected by the separator pattern SP. As described above, the separator pattern SP may have a reverse tapered shape, and the second electrode E2 may be disposed inside a cave structure formed under the separator pattern SP. A portion of the second electrode E2 disposed inside the cave may not be connected to a portion of the second electrode E2 disposed on the separator pattern SP, and may be disconnected. In the cave, the second electrode E2 may cover a side surface of an end portion of the functional layer FL. For example, in case that the functional layer FL is deposited by an evaporation method and the second electrode E2 is deposited by a sputtering method, the second electrode E2 may be deposited wider than the functional layer FL. The auxiliary wiring AW disposed below the separator pattern SP may have a narrower width than the separator pattern SP, and may be spaced apart from the second electrode E2 disposed inside the cave by a predetermined or selected distance. For example, the auxiliary wiring AW may not be connected to the second electrode E2. Accordingly, second electrodes E2 of adjacent pixels PX may not be electrically connected by the auxiliary wiring AW and the separator pattern SP, but may be separated.

The second electrode E2 may constitute the light emitting device ED such as an organic light emitting diode or an inorganic light emitting diode together with the first electrode E1 and the intermediate layer EL. The first electrode E1 may be an anode of the light emitting device ED, and the second electrode E2 may be a cathode of the light emitting device ED. In the display area DA, the auxiliary wiring AW and the separator pattern SP may have a shape surrounding the light emitting device ED of each pixel PX in a plan view. Accordingly, the light emitting devices ED of adjacent pixels PX may be separated by the auxiliary wiring AW and the separator pattern SP.

Hereinafter, the display device according to an embodiment will be described with reference to FIG. 16.

Figure 16:
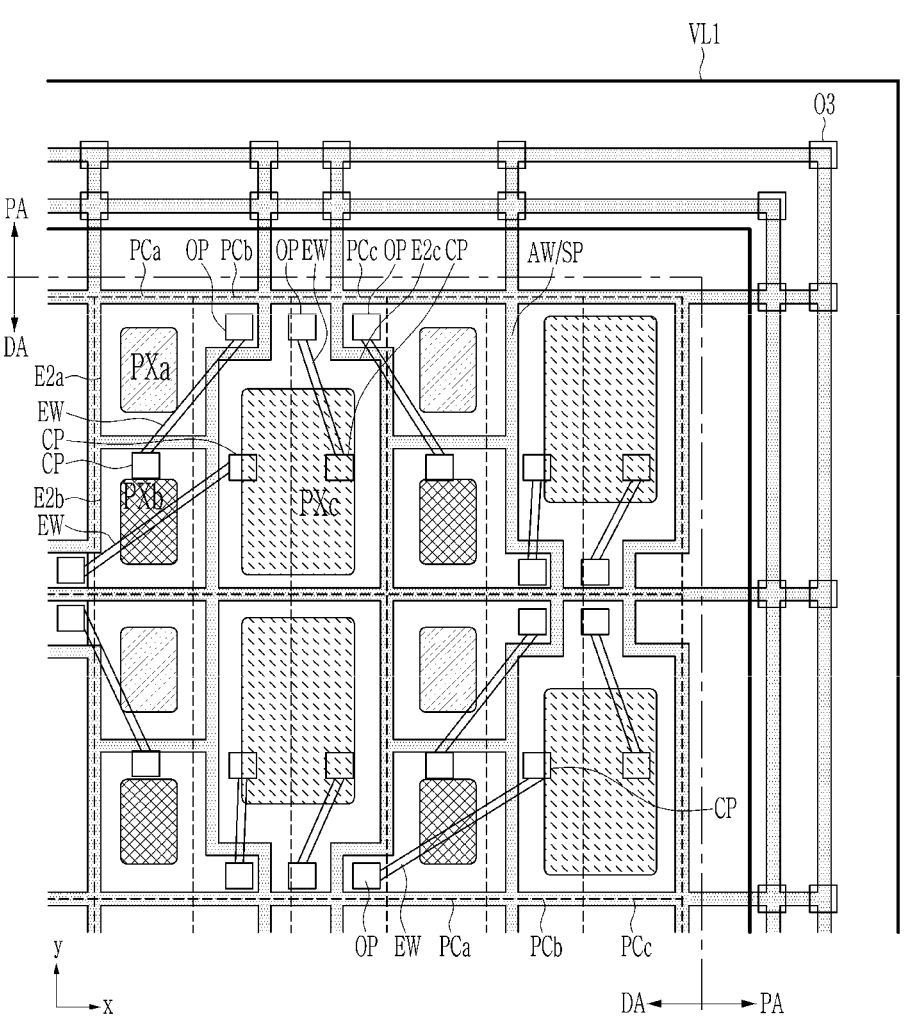
FIG. 16 is a plan view schematically illustrating the display device according to an embodiment.

Since the display device according to an embodiment shown in FIG. 16 may have substantially the same parts as the display device according to an embodiment shown in FIGS. 1 to 7, a description of the same parts will be omitted. In an embodiment, a planar shape of the auxiliary wiring AW in the peripheral area PA may be partially different from that of a previous embodiment, and will be described below.

FIG. 16 is a plan view schematically illustrating the display device according to an embodiment. FIG. 16 illustrates the display area DA of the display device according to an embodiment and the peripheral area PA adjacent to the display area DA.

As shown in FIG. 16, the display device according to an embodiment includes the auxiliary wiring AW and the separator pattern SP disposed in the display area DA and the peripheral area PA, and the first power voltage line VL1 disposed in the peripheral area PA.

In the display area DA, the auxiliary wiring AW and the separator pattern SP may extend in the first direction x and the second direction y to have a net shape. The auxiliary wiring AW and the separator pattern SP may be disposed to surround all pixels PXa, PXb, and PXc along an edge of the display area DA. In the display area DA, the second electrodes E2a, E2b, and E2c of each of the pixels PXa, PXb, and PXc may be separated from each other by the separator pattern SP.

In the peripheral area PA, the auxiliary wiring AW and the separator pattern SP may have a shape that overlaps the first power voltage line VL1 and surrounds the display area DA. The auxiliary wiring AW may have a bridge shape for connecting a portion disposed in the display area DA to a portion overlapping the first power voltage line VL1. In a previous embodiment, a portion in which the auxiliary wiring AW and the separator pattern SP overlap the first power voltage line VL1 and surround the display area DA may have a single bar shape that is bent at least once. In an embodiment, a portion in which the auxiliary wiring AW and the separator pattern SP overlap the first power voltage line VL1 and surround the display area DA may have two bar shapes that are bent at least once. One of the two bar shapes may be disposed closer to the display area DA than the other of the two bar shapes.

The auxiliary wiring AW may be connected to the first power voltage line VL1 to receive the first power voltage ELVDD. In the display device according to an embodiment, a larger area of the auxiliary wiring AW may be secured and a larger area of a connection part between the auxiliary wiring AW and the first power voltage line VL1 may be secured so that a voltage drop of a voltage transmitted through the auxiliary wiring AW is prevented.

Hereinafter, the display device according to an embodiment will be described with reference to FIG. 17.

Figure 17:
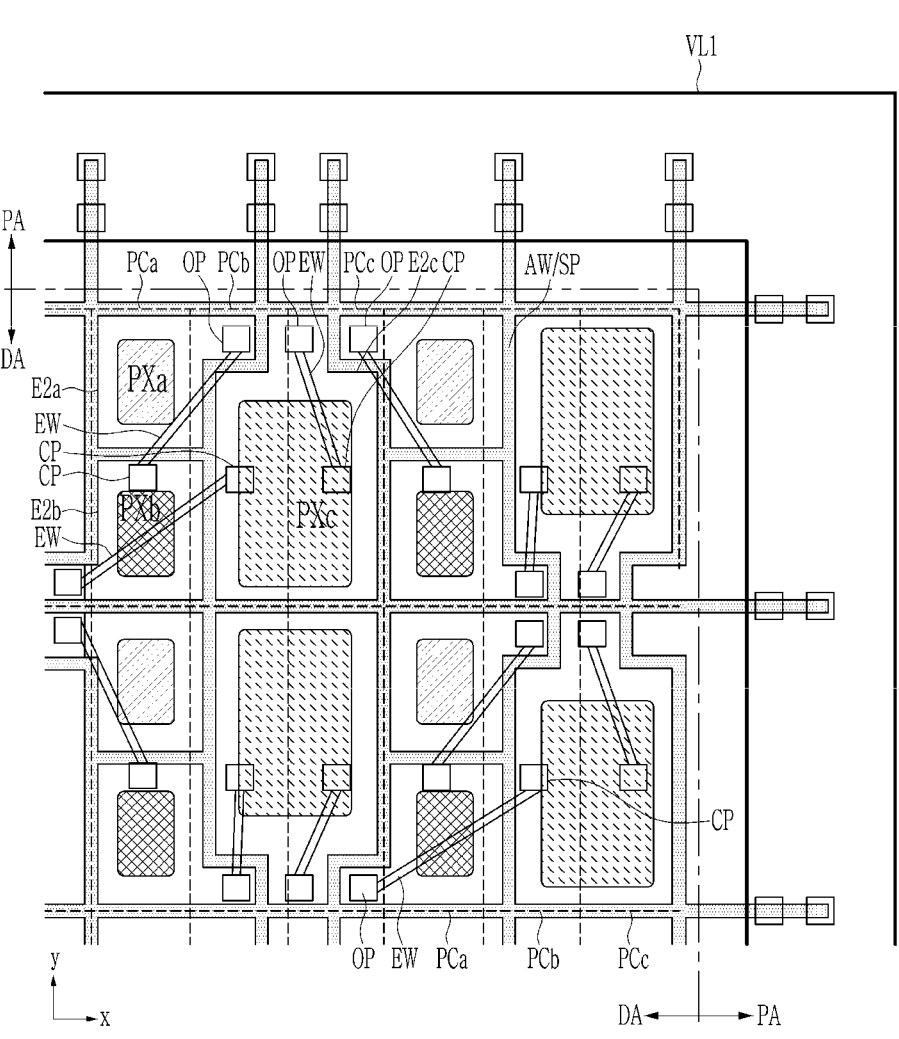
FIG. 17 is a plan view schematically illustrating the display device according to an embodiment.

Since the display device according to an embodiment shown in FIG. 17 may have substantially the same parts as the display device according to an embodiment shown in FIGS. 1 to 7, a description of the same parts will be omitted. In an embodiment, a planar shape of the auxiliary wiring AW in the peripheral area PA may be partially different from that of a previous embodiment, and will be described below.

FIG. 17 is a plan view schematically illustrating the display device according to an embodiment. FIG. 17 illustrates the display area DA of the display device according to an embodiment and the peripheral area PA adjacent to the display area DA.

As shown in FIG. 17, the display device according to an embodiment may include the auxiliary wiring AW and the separator pattern SP disposed in the display area DA and the peripheral area PA, and the first power voltage line VL1 disposed in the peripheral area.

In the peripheral area PA, the auxiliary wiring AW and the separator pattern SP may overlap the first power voltage line VL1. In a previous embodiment, the auxiliary wiring AW and the separator pattern SP may include an area (hereinafter referred to as a first area for convenience) having a shape surrounding the display area DA. The auxiliary wiring AW and the separator pattern SP may include an area (hereinafter referred to as a second area for convenience) having a bridge shape for connecting a portion disposed in the display area DA to the first area. In an embodiment, a portion corresponding to the first area of the auxiliary wiring AW and the separator pattern SP in a previous embodiment may be omitted, and a portion corresponding to the second area remains.

In an embodiment, the auxiliary wiring AW and the separator pattern SP may extend in a direction crossing an extension direction of the first power voltage line VL1 in the peripheral area PA to overlap the first power voltage line VL1. For example, a portion of the first power voltage line VL1 that extends in the first direction x and a portion of the auxiliary wiring AW and a portion of the separator pattern SP that extend in the second direction y may intersect and overlap each other. A portion of the first power voltage line VL1 that extends in the second direction y and a portion of the auxiliary wiring AW and a portion of the separator pattern SP that extend in the first direction x may intersect and overlap each other. The auxiliary wiring AW may be connected to the first power voltage line VL1 at a portion where the auxiliary wiring AW overlaps the first power voltage line VL1, and may receive the first power voltage ELVDD.

Hereinafter, the display device according to an embodiment will be described with reference to FIG. 18.

Figure 18:
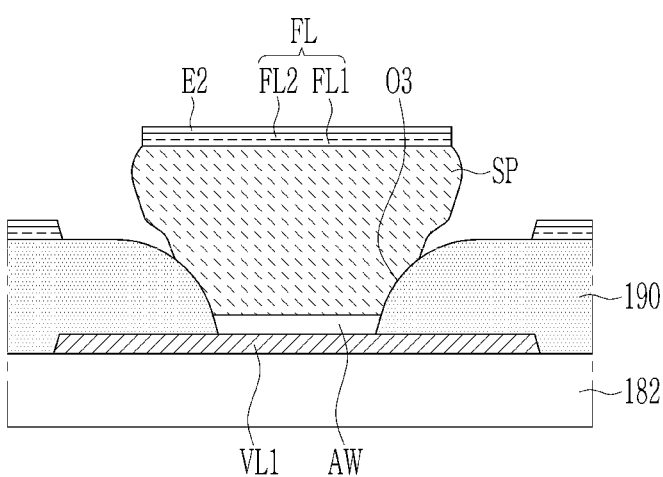
FIG. 18 is a cross-sectional view schematically illustrating the display device according to an embodiment.

Since the display device according to an embodiment shown in FIG. 18 may have substantially the same parts as the display device according to an embodiment shown in FIGS. 1 to 7, a description of the same parts will be omitted. In an embodiment, a shape of the auxiliary wiring AW may be partially different from that of a previous embodiment, and will be described below.

FIG. 18 is a cross-sectional view schematically illustrating the display device according to an embodiment. FIG. 18 illustrates the peripheral area PA of the display device according to an embodiment, and components such as the insulating layer and the like disposed below the fifth insulating layer 182 are omitted for convenience.

As shown in FIG. 18, the display device according to an embodiment may include the first power voltage line VL1, the auxiliary wiring AW connected to the first power voltage line VL1, and the separator pattern SP disposed on the auxiliary wiring AW.

The first power voltage line VL1 may be disposed on the fifth insulating layer 182, and the pixel defining layer 190 may be disposed on the first power voltage line VL1 and the fifth insulating layer 182. The pixel defining layer 190 may have the third opening O3 overlapping the first power voltage line VL1. The auxiliary wiring AW may be disposed in the third opening O3, and the auxiliary wiring AW may be disposed directly on the first power voltage line VL1 in the third opening O3. The auxiliary wiring AW may be connected to the first power voltage line VL1 to receive the first power voltage ELVDD.

In a previous embodiment, the auxiliary wiring AW is formed in the third opening O3 and may be formed even around the third opening O3. The auxiliary wiring AW may have a width that is similar to that of a lower portion of the separator pattern SP. In an embodiment, the auxiliary wiring AW may be formed in the third opening O3. The separator pattern SP may be disposed on the auxiliary wiring AW and the pixel defining layer 190 in the peripheral area PA. The auxiliary wiring AW may have a width that is narrower than that of a lower portion of the separator pattern SP.

In a previous embodiment, the auxiliary wiring AW and the separator pattern SP may be patterned in the same process using the same mask. In an embodiment, the auxiliary wiring AW and the separator pattern SP may be patterned in different processes using different masks. First, a first material layer may be formed on the pixel defining layer 190 and the auxiliary wiring AW may be formed by patterning the first material layer. Subsequently, a second material layer may be formed on the auxiliary wiring AW and the pixel defining layer 190, and the separator pattern SP may be formed by patterning the second material layer. Accordingly, the auxiliary wiring AW and the separator pattern SP may have different planar shapes. For example, a width of the auxiliary wiring AW may be formed to be narrower than a width of the separator pattern SP. Since the auxiliary wiring AW is covered by the separator pattern SP, the auxiliary wiring AW may not be exposed to the outside. Accordingly, it is possible to prevent the auxiliary wiring AW from being damaged in a subsequent process.

Hereinafter, the display device according to an embodiment will be described with reference to FIG. 19.

Figure 19:
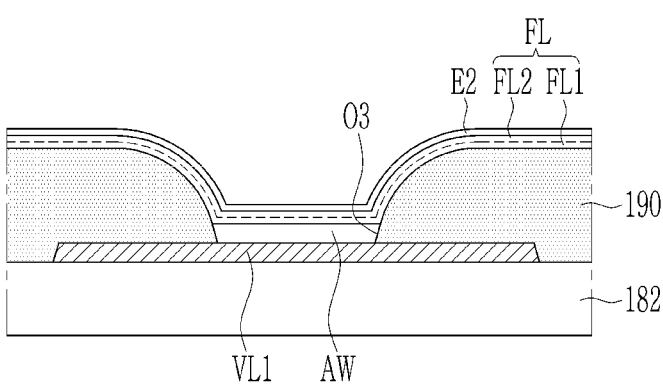
FIG. 19 is a cross-sectional view schematically illustrating the display device according to an embodiment.

Since the display device according to an embodiment shown in FIG. 19 may have substantially the same parts as the display device according to an embodiment shown in FIGS. 1 to 7, a description of the same parts will be omitted. An embodiment may be partially different from a previous embodiment at least in that the separator pattern SP may not be disposed in the peripheral area PA, and an embodiment will be described in more detail below.

FIG. 19 is a cross-sectional view schematically illustrating the display device according to an embodiment. FIG. 19 illustrates the peripheral area PA of the display device according to an embodiment, and components such as the insulating layer and the like disposed below the fifth insulating layer 182 are omitted for convenience.

As shown in FIG. 19, the display device according to an embodiment may include the first power voltage line VL1 and the auxiliary wiring AW connected to the first power voltage line VL1.

In a previous embodiment, the separator pattern SP may be disposed on the auxiliary wiring AW in the peripheral area PA, and in an embodiment, the separator pattern SP may not be disposed on the auxiliary wiring AW in the peripheral area PA. In an embodiment, the separator pattern SP may be disposed only in the display area DA and may not be disposed in the peripheral area PA. In an embodiment, the auxiliary wiring AW and the separator pattern SP may be patterned in different processes using different masks.

In the peripheral area PA, the functional layer FL may be disposed on the auxiliary wiring AW and the pixel defining layer 190, and the second electrode E2 may be disposed on the functional layer FL. Since the functional layer FL is disposed between the auxiliary wiring AW and the second electrode E2, the auxiliary wiring AW may not be electrically connected to the second electrode E2. The functional layer FL disposed in the peripheral area PA may not be separated but may be integrally formed. The functional layer FL disposed in the peripheral area PA may not be connected to the functional layer FL disposed in the display area DA, and may be separated from the functional layer FL disposed in the display area DA. Likewise, the second electrode E2 disposed in the peripheral area PA may not be separated but may be integrally formed. The second electrode E2 disposed in the peripheral area PA may not be connected to the second electrode E2 disposed in the display area DA, and may be separated from the second electrode E2 disposed in the display area DA.

As described above, the number of transistors and capacitors included in the pixel driving circuit of the display device according to an embodiment may be variously changed. Hereinafter, a modified example of the pixel driving circuit of the display device according to an embodiment will be described with reference to FIG. 20.

Figure 20:
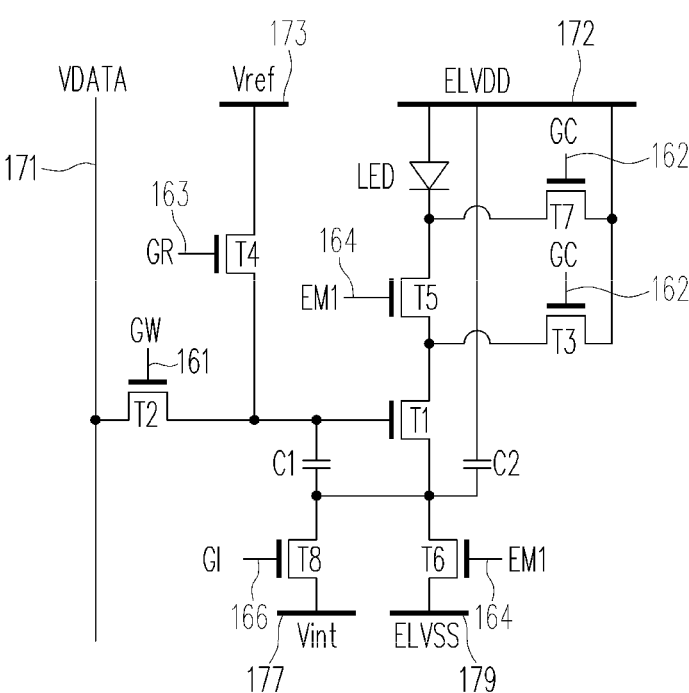
FIG. 20 is a circuit diagram schematically illustrating a pixel of the display device according to an embodiment.

FIG. 20 is a circuit diagram schematically illustrating a pixel of the display device according to an embodiment.

Referring to FIG. 20, the display device according to an embodiment may include multiple pixels PX, and each of the pixels PX may include a light emitting device LED and a pixel driving circuit connected to the light emitting device LED. The pixel driving circuit may include a first transistor T1, a second transistor T2, a third transistor T3, a fourth transistor T4, a fifth transistor T5, a sixth transistor T6, a seventh transistor T7, an eighth transistor T8, a first capacitor C1, and a second capacitor C2.

The pixel driving circuit may be connected to a first scan line 161 to which a first scan signal GW is applied, a second scan line 162 to which a second scan signal GC is applied, a third scan line 163 to which a third scan signal GR is applied, a fourth scan line 166 to which a fourth scan signal GI is applied, a first light emitting signal line 164 to which a first light emitting signal EM1 is applied, and a data line 171 to which a data voltage VDATA is applied. The pixel PX may be connected to a first power voltage line 172 to which the first power voltage ELVDD is applied, a second power voltage line 179 to which the second power voltage ELVSS is applied, a reference voltage line 173 to which a reference voltage Vref is applied, and an initialization voltage line 177 to which an initialization voltage Vint is applied.

A circuit structure of the pixel PX will be described below focusing on each element (the transistors T1 to T8, the capacitors C1 and C2, and the light emitting device LED) included in the pixel PX.

The first transistor T1 may include a gate electrode connected to a first electrode of the first capacitor C1, a second electrode of the second transistor T2, and a second electrode of the fourth transistor T4, a first electrode (or an input side electrode) connected to a second electrode of the third transistor T3 and a second electrode of the fifth transistor T5, and a second electrode (or an output side electrode) connected to a first electrode of the sixth transistor T6, a second electrode of the eighth transistor T8, a second electrode of the first capacitor C1, and a second electrode of the second capacitor C2.

A degree to which the first transistor T1 may be turned on is determined according to a voltage of the gate electrode, and a magnitude of a current flowing from the first electrode of the first transistor T1 to the second electrode may be determined according to the turned-on degree (or the degree to which the first transistor T1 is turned on). The current flowing from the first electrode of the first transistor T1 to the second electrode may be the same as an electric current flowing through the light emitting device LED in a light emitting interval. Thus, the current flowing from the first electrode of the first transistor T1 to the second electrode may be referred to as a light emitting current. Here, the first transistor T1 may be formed of an N-type transistor, and as a voltage of the gate electrode increases, a larger light emitting current may flow. In case that the light emitting current is large, the light emitting device LED may display high luminance.

The second transistor T2 (hereinafter also referred to as a data input transistor) may include a gate electrode connected to the first scan line 161 to which the first scan signal GW is applied, a first electrode (or an input side electrode) connected to the data line 171 to which the data voltage VDATA is applied, and a second electrode (or an output side electrode) connected to the first electrode of the first capacitor C1, the gate electrode of the first transistor T1, and the second electrode of the fourth transistor T4. The second transistor T2 may input the data voltage VDATA to the pixel PX according to the first scan signal GW to transmit the data voltage VDATA to the gate electrode of the first transistor T1 and to store the data voltage VDATA in the first electrode of the first capacitor C1.

The third transistor T3 (hereinafter also referred to as a first voltage transfer transistor) may include a gate electrode connected to the second scan line 162 to which the second scan signal GC is applied, a first electrode (or an input side electrode) connected to the first power voltage line 172, and a second electrode (or an output side electrode) connected to the first electrode of the first transistor T1 and the second electrode of the fifth transistor T5. The third transistor T3 may allow the first power voltage ELVDD to be transferred to the first transistor T1 without being transferred through the light emitting device LED. This may be to transmit the first power voltage ELVDD to the first transistor T1 through a separate path because the light emitting device LED may unnecessarily emit light in case that a current flows through the light emitting device LED. Therefore, the third transistor T3 may not be turned on in the light emitting interval, and may be turned on in an interval other than the light emitting interval.

The fourth transistor T4 (hereinafter also referred to as a reference voltage transfer transistor) may include a gate electrode connected to the third scan line 163 to which the third scan signal GR is applied, a first electrode (or an input side electrode) connected to the reference voltage line 173, and a second electrode (or an output side electrode) connected to the first electrode of the first capacitor C1, the gate electrode of the first transistor T1, and the second electrode of the second transistor T2. The fourth transistor T4 may serve to initialize the first electrode of the first capacitor C1 and the gate electrode of the first transistor T1 by transferring the reference voltage Vref to the first electrode of the first capacitor C1 and the gate electrode of the first transistor T1.

The fifth transistor T5 (hereinafter also referred to as a cathode connection transistor) may include a gate electrode connected to the first light emitting signal line 164 to which the first light emitting signal EM1 is applied, a first electrode (or an input side electrode) connected to a cathode of the light emitting device LED, and a second electrode (or an output side electrode) connected to the first electrode of the first transistor T1 and the second electrode of the third transistor T3. The fifth transistor T5 may connect the first electrode of the first transistor T1 to the light emitting device LED based on the first light emitting signal EM1 to form a current path, and allow the light emitting device LED to emit light.

The sixth transistor T6 (hereinafter referred to as a driving low voltage applying transistor) may include a gate electrode connected to the first light emitting signal line 164 to which the first light emitting signal EM1 is applied, a first electrode (or an input side electrode) connected to a second electrode of the first transistor T1, the second electrode of the first capacitor C1, and the second electrode of the second capacitor C2, and a second electrode (or an output side electrode) receiving the second power voltage ELVSS. The sixth transistor T6 may serve to transmit or block the second power voltage ELVSS to/from the second electrode of the first transistor T1 based on the first light emitting signal EM1.

The seventh transistor T7 (hereinafter also referred to as a second voltage transfer transistor) may include a gate electrode connected to the second scan line 162 to which the second scan signal GC is applied, a first electrode (or an input side electrode) connected to the first power voltage line 172, and a second electrode (or an output side electrode) connected to the cathode of the light emitting device LED and a first electrode of the fifth transistor T5. The seventh transistor T7 may serve to transfer the first power voltage ELVDD to the cathode and change a voltage level of the cathode to the first power voltage ELVDD so that the seventh transistor T7 removes a problem of not displaying black due to an electric charge remaining at the cathode and allows black to be clearly displayed.

The eighth transistor T8 (hereinafter also referred to as an initialization voltage transfer transistor) may include a gate electrode connected to the fourth scan line 166 to which the fourth scan signal GI is applied, a first electrode (or an input side electrode) connected to the initialization voltage line 177, and a second electrode (or an output side electrode) connected to the second electrode of the first transistor T1, the first electrode of the sixth transistor T6, the second electrode of the first capacitor C1, and the second electrode of the second capacitor C2. The eighth transistor T8 may serve to initialize the second electrode of the first transistor T1, the first electrode of the sixth transistor T6, the second electrode of the first capacitor C1, and the second electrode of the second capacitor C2 by transferring the initialization voltage Vint to the second electrode of the first transistor T1, the first electrode of the sixth transistor T6, the second electrode of the first capacitor C1, and the second electrode of the second capacitor C2.

In an embodiment of FIG. 20, all transistors T1 to T8 may be formed as N-type transistors, and each transistor may be turned on in case that a voltage of a gate electrode of each transistor is a high level voltage and may be turned off in case that the voltage of the gate electrode of each transistor is a low level voltage. A semiconductor layer included in each transistor may use a polycrystalline silicon semiconductor or an oxide semiconductor, and may also use an amorphous silicon semiconductor or a single crystalline silicon semiconductor.

In an embodiment, the semiconductor layer included in each transistor may further include an overlapping layer (or an additional gate electrode) overlapping the semiconductor layer, and a voltage is applied to the overlapping layer (or the additional gate electrode) to change a characteristic of the transistor so that a display quality of the pixel PX is further improved.

The first capacitor C1 may include a first electrode connected to the gate electrode of the first transistor T1, the second electrode of the second transistor T2, and the second electrode of the fourth transistor T4, and a second electrode connected to the second electrode of the first transistor T1, the first electrode of the sixth transistor T6, the second electrode of the eighth transistor T8, and the second electrode of the second capacitor C2. The first electrode of the first capacitor C1 may serve to receive and store the data voltage VDATA from the second transistor T2.

The second capacitor C2 may include a first electrode connected to the first power voltage line 172, and a second electrode connected to the second electrode of the first transistor T1, the first electrode of the sixth transistor T6, the second electrode of the eighth transistor T8, and the second electrode of the first capacitor C1. The second capacitor C2 may serve to constantly maintain a voltage of the second electrode of the first transistor T1 and a voltage of the second electrode of the first capacitor C1. In an embodiment, the second capacitor C2 may be omitted.

The light emitting device LED may include an anode connected to the first power voltage line 172 to receive the first power voltage ELVDD, and a cathode connected to the first electrode of the fifth transistor T5 and a second electrode of the seventh transistor T7. The cathode of the light emitting device LED may be connected to the first transistor T1 through the fifth transistor T5. The light emitting device LED may be disposed between the pixel driving circuit and the first power voltage ELVDD so that the same current as a current flowing through the first transistor T1 of the pixel driving circuit flows. Luminance emitted may be determined according to a magnitude of the current. The light emitting device LED may include a light emitting layer including at least one of an organic light emitting material and an inorganic light emitting material between the anode and the cathode. A detailed stack structure of the light emitting device LED according to an embodiment may be referred to in the description of FIG. 3 and FIG. 4.

The pixel PX according to an embodiment of FIG. 20 may perform a compensation operation for sensing a change in a characteristic (e.g., a threshold voltage) of the first transistor T1 to display constant luminance regardless of the change in the characteristic of the first transistor T1.

In FIG. 20, the light emitting device LED is disposed between the first electrode of the first transistor T1 and the first power voltage line 172. The pixel PX according to an embodiment may be distinguished from a pixel in which a light emitting device is disposed between the first transistor T1 and the second power voltage ELVSS. The light emitting device LED may exhibit luminance according to a current flowing from the first power voltage ELVDD to the second power voltage ELVSS through the first transistor T1, and may have higher luminance as the current increases. In a pixel structure of FIG. 20, since the first electrode of the first transistor T1 is connected to the light emitting device LED and the second electrode (a source electrode) of the first transistor T1 is separated from the light emitting device LED, there may be no change in a voltage of the second electrode of the first transistor T1 in case that a voltage of each portion of the pixel driving circuit is changed. More specifically, in case that the sixth transistor T6 is turned on, a voltage of the second electrode of the first capacitor C1 is lowered so that a voltage of the first electrode of the first capacitor C1 is also lowered. Thus, an output current output by the first transistor T1 may be lowered, but in an embodiment, a problem of a decrease in an output current of the first transistor T1 is eliminated.

In an embodiment of FIG. 20, one pixel PX includes eight transistors T1 through T8 and two capacitors (the first capacitor C1 and the second capacitor C2), but the disclosure is not limited thereto. In an embodiment, a capacitor or a transistor may be additionally included, and a capacitor or a transistor may be omitted.

While this disclosure has been described in connection with what is considered to be practical embodiments, it is to be understood that the disclosure is not limited to the disclosed embodiments, but, on the contrary, is intended to cover various modifications and equivalent arrangements included within the spirit and scope of the disclosure.

What is claimed is:
1. A display device, comprising:
a transistor that is disposed on a substrate;
a first electrode that is disposed on the substrate;
a pixel defining layer that is disposed on the first electrode;
a separator pattern that is disposed on the pixel defining layer;
auxiliary wiring that is disposed between the pixel defining layer and the separator pattern;
a second electrode that is disposed on the first electrode, the pixel defining layer, and the separator pattern;
connection wiring that connects between the transistor and the second electrode; and
an intermediate layer that is disposed between the first electrode and the second electrode,
wherein a portion of the second electrode disposed on the separator pattern and a portion of the second electrode disposed around the separator pattern are separated from each other.
2. The display device of claim 1, comprising:
a display area that displays an image; and
a peripheral area that surrounds the display area,
wherein the auxiliary wiring is disposed in the display area and the peripheral area.
3. The display device of claim 2, further comprising:
a first power voltage line disposed in the peripheral area and transmitting a high potential power voltage, wherein the auxiliary wiring is connected to the first power voltage line.

4. The display device of claim 3, wherein
the pixel defining layer is disposed on the first power voltage line,
the pixel defining layer includes an opening overlapping the first power voltage line, and
the auxiliary wiring is connected to the first power voltage line in the opening.

5. The display device of claim 4, wherein
the separator pattern is disposed on the auxiliary wiring in the peripheral area, and
a width of the auxiliary wiring is the same as a width of a lower portion of the separator pattern.

6. The display device of claim 4, wherein
the separator pattern is disposed on the auxiliary wiring and the pixel defining layer in the peripheral area, and
a width of the auxiliary wiring is narrower than a width of a lower portion of the separator pattern.

7. The display device of claim 4, wherein
the separator pattern is disposed in the display area and is not disposed in the peripheral area, and
the intermediate layer is disposed directly on the auxiliary wiring in the peripheral area.

8. The display device of claim 4, wherein the first power voltage line is disposed on a same layer as the first electrode.

9. The display device of claim 2, wherein the auxiliary wiring disposed in the display area and the auxiliary wiring disposed in the peripheral area are integrally formed by being connected to each other.

10. The display device of claim 9, wherein
the auxiliary wiring disposed in the display area has a net shape in a plan view, and
the auxiliary wiring disposed in the peripheral area has a shape surrounding the display area in the plan view.

11. The display device of claim 1, wherein a constant voltage is applied to the auxiliary wiring.

12. The display device of claim 1, wherein the auxiliary wiring includes an oxide semiconductor.

13. The display device of claim 1, wherein
the pixel defining layer includes a positive type photosensitive resin, and
the separator pattern includes a negative type photosensitive resin.

14. A method for manufacturing a display device, comprising:
forming a transistor above a substrate;
forming connection wiring connected to the transistor;
forming an insulating layer on the connection wiring;
forming a first electrode on the insulating layer;
forming a pixel defining layer on the first electrode;
patterning the pixel defining layer to form a first opening overlapping the first electrode and a second opening overlapping the connection wiring;
forming auxiliary wiring and a separator pattern that overlap each other on the pixel defining layer;
forming an intermediate layer on the first electrode, the pixel defining layer, and the separator pattern; and forming a second electrode connected to the connection wiring on the intermediate layer.

15. The method of claim 14, wherein the forming of the pixel defining layer and the separator pattern comprises:
sequentially stacking a first material layer and a second material layer on the pixel defining layer;
forming the separator pattern by patterning the second material layer; and
forming the auxiliary wiring by patterning the first material layer using the separator pattern as a mask.

16. The method of claim 15, wherein
the first material layer includes an oxide semiconductor, and
the second material layer includes a negative type photosensitive resin.

17. The method of claim 16, wherein the pixel defining layer includes a positive type photosensitive resin.

18. The method of claim 17, wherein
a width of the first opening and a width of the second opening are gradually widened as the first opening and the second opening move away from the substrate, and
a width of the separator pattern is gradually widened as the separator pattern moves away from the substrate.

19. The method of claim 15, wherein a width of the auxiliary wiring is the same as a width of a lower portion of the separator pattern.

20. The method of claim 14, wherein the forming of the pixel defining layer and the separator pattern comprises:
forming a first material layer on the pixel defining layer;
patterning the first material layer to form the auxiliary wiring;
forming a second material layer on the auxiliary wiring; and
patterning the second material layer to form the separator pattern.

21. The method of claim 20, wherein a width of the auxiliary wiring is narrower than a width of a lower portion of the separator pattern.

22. The method of claim 14, wherein the display device comprises:
a display area that displays an image; and
a peripheral area that surrounds the display area,
wherein the auxiliary wiring is disposed in the display area and the peripheral area.

23. The method of claim 22, wherein
the forming of the first electrode further comprises forming a first power voltage line that transmits a high potential power voltage in the peripheral area, and
the auxiliary wiring is connected to the first power voltage line.

24. The method of claim 23, wherein
the forming of the first opening and the second opening in the pixel defining layer further comprises forming a third opening overlapping the first power voltage line in the pixel defining layer, and
the auxiliary wiring is connected to the first power voltage line in the third opening.

* * * * *